(12) United States Patent
Saito et al.

(10) Patent No.: US 10,295,590 B2
(45) Date of Patent: May 21, 2019

(54) PROBE CARD WITH TEMPERATURE CONTROL FUNCTION, INSPECTION APPARATUS USING THE SAME, AND INSPECTION METHOD

(71) Applicant: KABUSHIKI KAISHA NIHON MICRONICS, Tokyo (JP)

(72) Inventors: Yuki Saito, Tokyo (JP); Yoshiyuki Fukami, Tokyo (JP); Hidehiro Kiyofuji, Tokyo (JP)

(73) Assignee: KABUSHIKI KAISHA NIHON MICRONICS, Tokyo (JP)

( * ) Notice: Subject to any disclaimer, the term of this patent is extended or adjusted under 35 U.S.C. 154(b) by 53 days.

(21) Appl. No.: 15/628,076

(22) Filed: Jun. 20, 2017

(65) Prior Publication Data

US 2017/0363680 A1    Dec. 21, 2017

(30) Foreign Application Priority Data

Jun. 21, 2016 (JP) .................................. 2016-122268

(51) Int. Cl.
*G01R 31/28* (2006.01)
*G01R 1/073* (2006.01)

(52) U.S. Cl.
CPC ..... *G01R 31/2874* (2013.01); *G01R 1/07378* (2013.01); *G01R 31/2875* (2013.01);
(Continued)

(58) Field of Classification Search
CPC ............ G01R 31/2889; G01R 31/2875; G01R 31/2863; G01R 31/2886; G01R 1/0491;
(Continued)

(56) References Cited

U.S. PATENT DOCUMENTS 6,265,888 B1 *  7/2001  Hsu ..................... G01R 31/2863
                                                    324/750.03
7,227,370 B2 *  6/2007  Kasukabe .......... G01R 31/2886
                                                    324/754.15
(Continued)

FOREIGN PATENT DOCUMENTS

JP    H06151530 A    5/1994
JP    2001-210686    8/2001
(Continued)

OTHER PUBLICATIONS

Korean Intellectual Property Office, Office Action, dated Dec. 5, 2018, 6 pages.

*Primary Examiner* — Vinh P Nguyen
(74) *Attorney, Agent, or Firm* — Muncy, Geissler, Olds & Lowe, P.C.

(57) ABSTRACT

A probe card having uniform temperature distribution under control to a desired temperature is provided, so as to provide an inspection apparatus and an inspection method. The probe card includes a supporting substrate, a wiring layer arranged including a wiring on a main surface of the supporting substrate, a probe arranged on a surface serving as an opposite side to a side of the supporting substrate of the wiring layer so as to be connected to the wiring, and a plurality of heaters. Further, the probe card is virtually divided into heater regions according to a plurality of heater regions arrayed in vertical and horizontal directions in plan view, and at least one of a plurality of heaters is arranged in each of the plurality of heater regions. An inspection apparatus is configured including the probe card, and an object to be inspected is inspected by use of the inspection apparatus.

12 Claims, 11 Drawing Sheets

(52) U.S. Cl.
CPC ...... *G01R 1/07307* (2013.01); *G01R 31/2863* (2013.01); *G01R 31/2891* (2013.01)

(58) Field of Classification Search
CPC ............ G01R 1/07378; G01R 31/2831; G01R 31/2867; G01R 1/0433; G01R 1/06711; G01R 1/06744; G01R 1/0675; G01R 1/073; G01R 31/02; G01R 31/2891; G01R 1/07307
See application file for complete search history.

(56) References Cited

U.S. PATENT DOCUMENTS

| | | | |
|---|---|---|---|
| 7,667,474 B2 | 2/2010 | Sunohara et al. | |
| 8,680,880 B2 * | 3/2014 | Kiyofuji | G01R 31/2875 324/754.01 |
| 2006/0139042 A1 | 6/2006 | Kasukabe | |
| 2008/0116925 A1 | 5/2008 | Sunohara et al. | |
| 2010/0164520 A1 | 7/2010 | Kiyofuji | |
| 2010/0289514 A1 | 11/2010 | Washio et al. | |

FOREIGN PATENT DOCUMENTS

| | | |
|---|---|---|
| JP | 2004-150999 | 5/2004 |
| JP | 2012-256799 | 12/2012 |
| TW | 200823472 A | 6/2008 |

* cited by examiner

PROBE CARD WITH TEMPERATURE CONTROL FUNCTION, INSPECTION APPARATUS USING THE SAME, AND INSPECTION METHOD

This application is based on and claims the benefit of priority from Japanese Patent Applications No. 2016-122268, filed on 21 Jun. 2016, the content of which is incorporated herein by reference.

BACKGROUND OF THE INVENTION

Field of the Invention

The present invention relates to a probe card, an inspection apparatus, and an inspection method. In particular, the present invention relates to a probe card capable of conducting, in an electrical test on a semiconductor chip by use of a probe card, high-temperature testing in which a semiconductor wafer is heated to conduct an electrical test on a semiconductor chip at a high temperature, and relates to an inspection apparatus and an inspection method by use of the probe card.

Related Art

A large number of semiconductor chips such as ICs incorporated in a semiconductor wafer are, prior to being cut and separated from the semiconductor wafer, subjected to an electrical test as an object to be inspected as to whether or not the semiconductor chips have the performance as specified in a specification. As such an electrical test, for example, a method for supplying an inspection signal to the electrodes of the semiconductor chips on the semiconductor wafer to analyze a detected signal is adopted.

In the electrical test on the semiconductor chips as described above, a probe card is used as an inspection tool in order to provide electrical connection between the electrodes of the semiconductor chips and a test wiring board (or an electrical circuit or the like) connected to a tester of a prober or the like. The probe card includes a supporting substrate, a wiring layer arranged on a main surface which is one surface of the supporting substrate, and a plurality of probes respectively connected to the wiring in the wiring layer.

In the probe card, the main surface which is the surface on the side where the probes are arranged faces the semiconductor wafer on which a semiconductor chip serving as an object to be inspected is formed. For example, the semiconductor wafer is stably placed on an XYZ stage which is movable in respective directions of X-axis, Y-axis and Z-axis orthogonal to each other by such as suction means utilizing negative pressure. Thus, the probe card brings each of the plurality of probes from above in contact with each of the electrodes for inspection of the semiconductor chips, and thus provides electrical connection between the electrodes of the semiconductor chips and a device such as a tester of a prober.

The electrical test on a semiconductor chip using such a probe card includes, in addition to testing in a room temperature or lower temperature, high-temperature testing in which a semiconductor chip is heated through heating of a semiconductor wafer, and an electrical test is conducted under a high-temperature state, as an example.

Conventionally, a semiconductor wafer on which a semiconductor chip as an object to be inspected is formed has been heated by a heater arranged on an XYZ stage on which the semiconductor wafer is placed. The semiconductor wafer heated by such a heater is affected by heating, and the spacing between electrodes for inspection of the semiconductor chip formed on the semiconductor wafer is expanded. For this reason, in a case where a difference in temperature between the semiconductor wafer and the probe card occurs, deviation may occur between the spacing between probes of the probe card and the spacing between electrodes of the semiconductor chip. In the case where such deviation occurs, it is impossible to bring the tips of the probes properly into contact with the electrodes of the semiconductor chip to provide electrical connection, which is a problem.

As a technology to deal with such a problem of deviation of the contact positions of the probes due to heating of an object to be inspected, for example, as disclosed in Japanese Patent Laid-Open Publication No. 2012-256799 (hereinafter referred to as Patent Document 1), a technology for heating a probe card with a built-in heater to a desired temperature is known.

That is, in the probe card of Patent Document 1, the probe card may be heated by use of one heater embedded in a supporting substrate. Thus, for example, in high-temperature testing on a semiconductor chip, the probe card is heated in a manner that the supporting substrate is heated to a predetermined temperature, resulting in the probe card reaching to the same temperature as the semiconductor wafer, depending on the temperature of the heater which is incorporated in the XYZ stage and which heats the semiconductor wafer to a predetermined temperature. This prevents the deviation of the contact positions of probes from occurring, even if an object to be inspected is heated.

However, in Patent Document 1, when the semiconductor wafer is heated by the heater incorporated in the XYZ stage, the probe card may be affected in some cases. The influence of heating by such a built-in heater in the XYZ stage includes, for example, generation of radiant heat from various components inside the probe card and/or a prober.

According to the description above, in a conventional probe card, non-uniform temperature distribution may occur due to the influence of the heating of the semiconductor wafer by the heater incorporated in the XYZ stage before heating is performed by the heater embedded in the supporting substrate.

Therefore, when heating is performed by use of one heater embedded in the supporting substrate, such a conventional probe card is affected by the non-uniform temperature distribution originally existing on the supporting substrate.

With such a conventional probe card, as for such originally-existing non-uniform temperature distribution, it is difficult to eliminate the influence of the above-described non-uniform temperature distribution originally existing on the supporting substrate, and it is difficult to form uniform temperature distribution on the supporting substrate.

In addition, in the case where the probe card having non-uniform temperature distribution is heated by use of one heater embedded in the supporting substrate, a region having much higher temperature than a target temperature may be generated. Such occurrence of a high-temperature region in the supporting substrate generates more non-uniform temperature distribution on the supporting substrate, thus causing cracking of the supporting substrate and breakage of the probe card in some cases.

SUMMARY OF THE INVENTION

An object of the present invention is to provide a probe card having uniform temperature distribution under control to a desired temperature to provide an inspection apparatus and an inspection method. Other objects and advantages of the present invention will become apparent based on the following description.

A probe card of a first aspect of the present invention includes a supporting substrate, a wiring layer arranged including a wiring on one surface of the supporting substrate, a probe arranged on a surface serving as an opposite side to a side of the supporting substrate of the wiring layer so as to be connected to the wiring, a plurality of heater regions divided virtually in plan view and arrayed in vertical and horizontal directions, and a plurality of first heaters, at least one of which is arranged in each of the heater regions.

The probe card of the first aspect of the present invention desirably has a plurality of controllers for individually controlling a calorific value of each of the plurality of first heaters.

In the probe card of the first aspect of the present invention, each of the plurality of first heaters is desirably embedded in the supporting substrate, corresponding to each of the plurality of heater regions.

The probe card of the first aspect of the present invention desirably has a plurality of temperature sensors arranged corresponding to each of the plurality of heater regions.

In the probe card of the first aspect of the present invention, the heater region desirably has a rectangular shape in plan view with one side of the rectangular shape being in a range of 10 mm to 40 mm.

The probe card of the first aspect of the present invention desirably includes a heat insulating member arranged at a part corresponding to a boundary between the heater regions in the supporting substrate.

The probe card of the first aspect of the present invention desirably includes a heat insulating member arranged at a part corresponding to a boundary between the heater regions in the supporting substrate, wherein the heat insulating member is formed in a partition wall shape for partitioning an inside of the supporting substrate corresponding to the plurality of heater regions.

A second aspect of the present invention relates to an inspection apparatus for inspecting an object to be inspected by use of a probe card, and the inspection apparatus includes an XYZ stage on which the object to be inspected is placed, the probe card according to the first aspect, including a plurality of controllers for individually controlling a calorific value of each of the plurality of first heaters, and a temperature controller to which a target temperature of the probe card is input.

In the inspection apparatus of the second aspect of the present invention, the XYZ stage desirably has a second heater for receiving the object to be inspected in a heatable state.

In the inspection apparatus of the second aspect of the present invention, the probe card desirably has a plurality of temperature sensors arranged corresponding to each of the plurality of heater regions of the supporting substrate, and each of the plurality of controllers desirably controls a calorific value of each of the plurality of first heaters based on the target temperature and an output by each of the plurality of temperature sensors.

In the inspection apparatus of the second aspect of the present invention, the supporting substrate of the probe card desirably includes a heat insulating member arranged at a part corresponding to a boundary between the heater regions.

A third aspect of the present invention relates to an inspection method for inspecting an object to be inspected by use of a probe card, and the inspection method includes the step of, by use of the probe card according to first aspect which includes a plurality of controllers for individually controlling a calorific value of each of the plurality of first heaters and a plurality of temperature sensors, inspecting the object to be inspected by individually controlling a temperature of each of the plurality of heater regions so as to bring the probe card to a target temperature, wherein a temperature control for individually controlling the temperature of each of the plurality of heater regions includes a temperature setting step of setting the target temperature, a current supplying step of supplying current to the plurality of first heaters based on the target temperature, a heater heating step of heating each of the heater regions including each of the first heaters by use of each of the first heaters supplied with the current, and a temperature measuring step of, by use of each of the temperature sensors arranged in each of the heater regions, measuring the temperature of each of the heater regions based on an output by each of the temperature sensors, and further includes, after the temperature measuring step, a determining step of determining repetition of the temperature measuring step, upon the temperature of each of the heater regions being equal to the target temperature, and of determining repetition in an order of the current supplying step, the heater heating step and the temperature measuring step, upon the temperature of each of the heater regions being different from the target temperature.

DETAILED DESCRIPTION OF THE INVENTION

Figure 10:
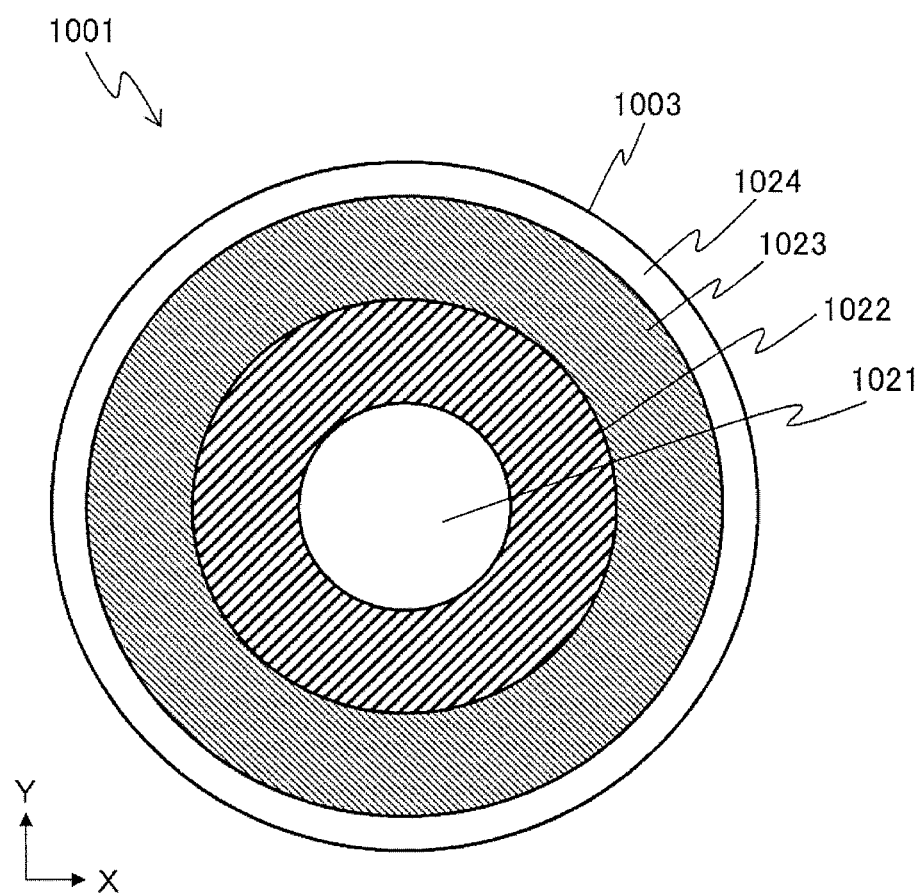
FIG. 10 is a diagram schematically showing an example of temperature distribution appeared on the probe card in an electrical test in which a semiconductor wafer on which a semiconductor chip of an object to be inspected is formed is heated.

FIG. 10 is a diagram schematically showing an example of temperature distribution appeared on the probe card in an electrical test in which a semiconductor wafer on which a semiconductor chip of an object to be inspected is formed is heated.

FIG. 10 schematically shows an example of the temperature distribution appeared on a supporting substrate 1003 of a probe card 1001 in a general inspection apparatus. That is, the example of FIG. 10 which is a state of the supporting substrate 1003 of the probe card facing a semiconductor wafer when the semiconductor wafer is heated by use of a heater arranged in an XYZ stage not shown in the figure, schematically shows non-uniform temperature distribution on the supporting substrate 1003 appeared before the probe card 1001 is heated by use of a heater included in the probe card.

In FIG. 10 showing a first temperature region 1021, a second temperature region 1022, a third temperature region 1023, and a fourth temperature region 1024 which will be described below, normally the boundaries between the respective regions are not such clear boundaries at which remarkable temperature difference occurs. As described above, the first temperature region 1021, the second temperature region 1022, the third temperature region 1023, and the fourth temperature region 1024 schematically show the temperature distribution appeared on the supporting substrate 1003. In the vicinity of each of the boundaries between above-described regions, the temperature gradually changes in a normal case.

As shown in FIG. 10, the supporting substrate 1003 of the probe card 1001 formed in the same shape as that of a semiconductor wafer to be inspected, has a substantially circular shape in plan view. On the supporting substrate 1003 of the probe card 1001, non-uniform temperature distribution is appeared before the probe card 1001 is heated by use of a built-in heater not shown in the figure. In the example shown in FIG. 10, the supporting substrate 1003 of the probe card 1001 includes the first temperature region 1021, the second temperature region 1022, the third temperature region 1023, and the fourth temperature region 1024.

On the supporting substrate 1003, for example, a substantially circular region including the central part thereof is the first temperature region 1021. The second temperature region 1022, for example, is formed around the outside of the first temperature region 1021. Further, for example, the third temperature region 1023 is formed around the outside of the second temperature region 1022, and the fourth temperature region 1024 is formed around the outside of the third temperature region 1023.

Then, when the temperatures of the first temperature region 1021, the second temperature region 1022, the third temperature region 1023, and the fourth temperature region 1024 are compared, in an example, the first temperature region 1021 is the highest temperature region. Then, in an example, the fourth region 1024 is the lowest temperature region.

Further, in an example, the second temperature region 1022 is a region lower in temperature than the first temperature region 1021, and is a region higher in temperature than the fourth temperature region 1024. Further, in an example, the third temperature region 1023 is a region lower in temperature than the second temperature region 1022, and is a region higher in temperature than the fourth region 1024. That is, on the supporting substrate 1003, non-uniform temperature distribution is appeared, in an example, where the temperature gradually decreases in the order of the first temperature region 1021, the second temperature region 1022, the third temperature region 1023, and the fourth temperature region 1024.

On the supporting substrate 1003 having the non-uniform temperature distribution illustrated in FIG. 10, it is difficult to provide uniform temperature distribution under control to a desired temperature as a whole, even by heating by use of one heater commonly equipped. That is, although one heater of the probe card substantially uniformly heats the entire of the supporting substrate 1003, it is considered difficult to provide uniform temperature distribution on the supporting substrate 1003.

Figure 11:
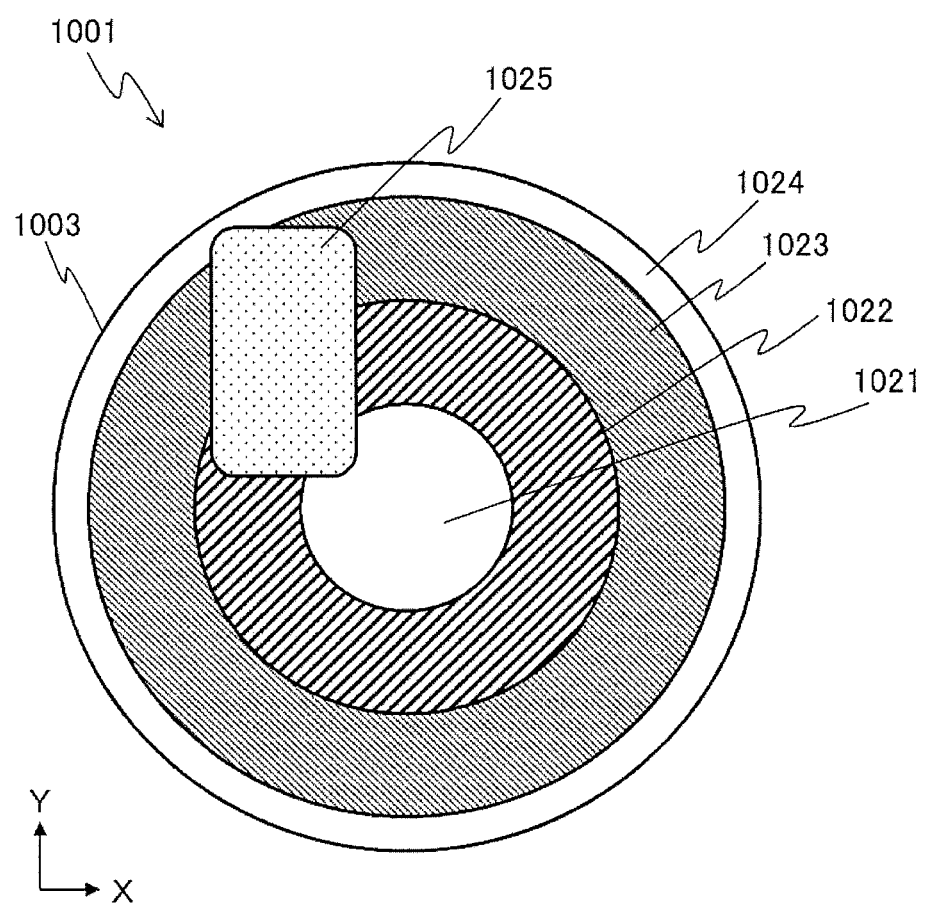
FIG. 11 is a diagram schematically showing another example of the temperature distribution appeared on the probe card in the electrical test in which the semiconductor wafer on which a semiconductor chip of an object to be inspected is formed is heated.

FIG. 11 is a diagram schematically showing another example of the temperature distribution appeared in the probe card in the electrical test in which the semiconductor wafer on which a semiconductor chip of an object to be inspected is formed is heated.

FIG. 11 schematically shows another example of the non-uniform temperature distribution appeared on the supporting substrate 1003 before the probe card 1001 is heated by use of the built-in heater in a general inspection apparatus as in FIG. 10.

In the example of FIG. 11, as in the example of FIG. 10, before the probe card 1001 is heated, the first temperature region 1021, the second temperature region 1022, the third temperature region 1023, and the fourth temperature region 1024 are appeared on the supporting substrate 1003. Furthermore, the example of FIG. 11 shows a state in which a fifth temperature region 1025 which is a region lower in temperature than the surroundings thereof is additionally appeared on the supporting substrate 1003 due to the influence of various components inside the inspection apparatus. Therefore, in the example of FIG. 11, more complicated temperature distribution is appeared on the supporting substrate 1003 of the probe card 1001.

As for the supporting substrate 1003 where a more complicated temperature distribution is appeared as shown in FIG. 11, it is difficult to provide uniform temperature distribution under control to a desired temperature, even by substantially uniformly heating the entire of the supporting substrate 1003 by use of the commonly-equipped heater.

Here, as a result of intensive studies, the inventors have found that the temperature distribution may be more precisely controlled by virtually dividing the probe card into a plurality of heater regions and arranging a plurality of heaters corresponding to each of the plurality of heater regions. The inventors also have found that the temperature distribution may be further precisely controlled by arranging a plurality of temperature sensors corresponding to each of the above-described plurality of heater regions to provide precise temperature control for each heater region.

Here, some embodiments of the present invention will be described with reference to appropriate figures.

Embodiment 1

As described above, the probe card of the first embodiment of the present invention is virtually divided into a plurality of heater regions with a plurality of heaters arranged corresponding to each of the plurality of heater regions, so as to provide precise control of temperature distribution.

More specifically, in the probe card of the first embodiment of the present invention, a plurality of heaters are arranged corresponding to each of a plurality of heater regions that may be virtually divided, so as to provide precise control of temperature distribution. Furthermore, the probe card of the first embodiment may have a plurality of temperature sensors arranged corresponding to each of the plurality of heater regions described above, thus enabling more precise control of temperature distribution.

Figure 1:
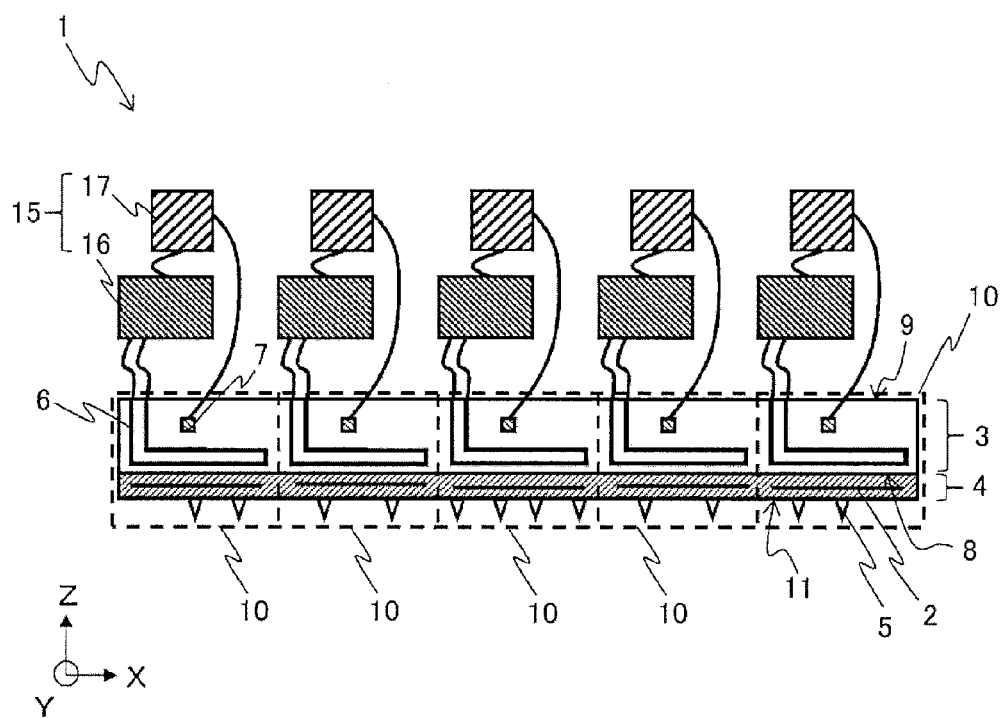
FIG. 1 is a cross-sectional view schematically showing a structure of a probe card according to a first embodiment of the present invention.

FIG. 1 is a cross-sectional view schematically showing a structure of the probe card of the first embodiment of the present invention.

As shown in FIG. 1, the probe card 1 of the first embodiment of the present invention is configured including a supporting substrate 3, a wiring layer 4 arranged including a wiring 2 on a main surface 8 which is one surface of the supporting substrate 3, a probe 5 which is arranged on a surface 11 serving as the opposite side to the side of the supporting substrate 3 of the wiring layer 4 so as to be connected to the wiring 2, and a plurality of heaters 6.

Figure 2:
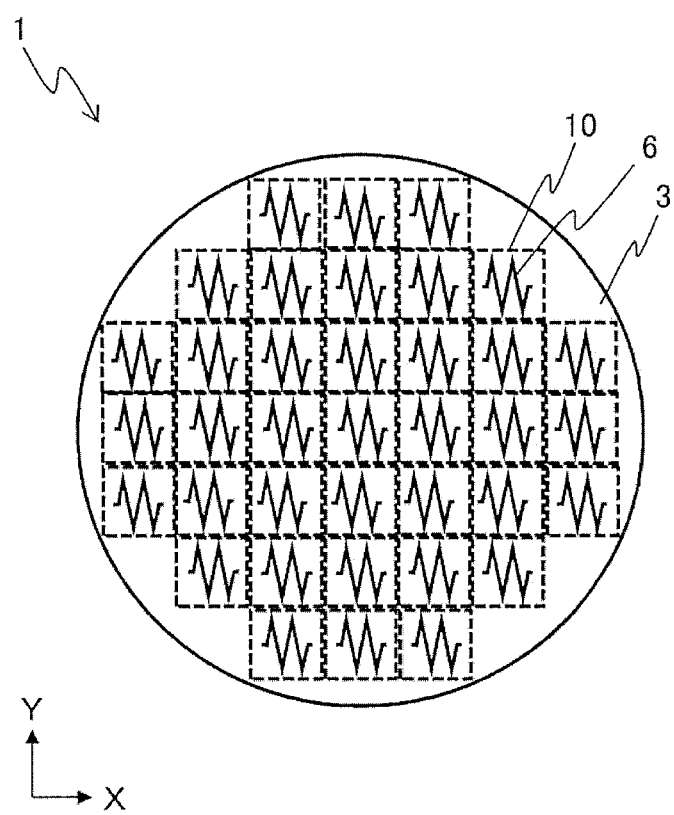
FIG. 2 is a diagram schematically showing a structure of the probe card of the first embodiment of the present invention virtually divided into a plurality of heater regions.

As shown in FIG. 2 described below, the probe card 1 is virtually divided into a plurality of heater regions 10 arrayed in vertical and horizontal directions in plan view. In FIG. 1, each of the heater regions 10 is shown as a region surrounded by a broken line.

In the probe card 1, at least one of the above-described plurality of heaters 6 is arranged in each of the plurality of heater regions 10. Therefore, the probe card 1 has the plurality of heaters 6 arranged corresponding to each of the plurality of heater regions 10.

Further, the probe card 1 has a plurality of controllers 15 that individually control a calorific value of each of the plurality of heaters 6. The controller 15 controls the calorific value generated by the heater 6 so as to bring the temperature in the heater region 10 to a temperature as a target for heating, that is, a target temperature through heating by the heater 6.

Further, the probe card 1 may have a plurality of temperature sensors 7. Therefore, the probe card 1 may have the plurality of temperature sensors 7 arranged corresponding to each of the plurality of heater regions 10.

The probe card 1 having the above-described structure is incorporated in, for example, an inspection apparatus (not shown in FIG. 1) and is used for inspection such as in an electrical test of an object to be inspected having an electrode (not shown in FIG. 1).

Here, the structure of the probe card 1 of the first embodiment of the present invention will be detailed with reference to the figures.

As described above, the probe card 1 of the first embodiment of the present invention has the supporting substrate 3.

The supporting substrate 3 which is an insulating substrate may be configured with ceramic material, for example. As other material of the supporting substrate 3, resin material such as polyimide is available.

On the supporting substrate 3, for example, the surface on the opposite side to the side of the main surface 8 which is one surface side where the probe 5 is arranged is a connection terminal surface 9. On the connection terminal surface 9, a connection terminal (not shown in the figure) may be arranged for connection to a device (not shown in the figure) such as a tester of a prober.

In the supporting substrate 3, a wiring path part (not shown in the figure) is arranged so as to extend from the connection terminal arranged on the connection terminal surface 9 described above to the main surface 8 through the supporting substrate 3 in the thickness direction thereof.

In the probe card 1, the wiring layer 4 is arranged on the main surface 8 of the supporting substrate 3. The wiring layer 4 is formed by use of, for example, ceramic material or resin material such as polyimide, and is configured including the wiring 2 inside or other part.

The wiring layer 4 has a plurality of probe lands (not shown in the figure) on a surface 11 serving as the opposite side to the side of the supporting substrate 3. The wiring 2 in the wiring layer 4 extends from each of the probe lands and is connected to the end part on the side of the wiring layer 4 of the above-described wiring path part inside the supporting substrate 3. Then, the wiring 2 forms a wiring path (not shown in the figure) of the probe card 1 together with the wiring path part inside the supporting substrate 3.

In the probe card 1, the probe 5 may be, for example, a cantilever-type probe or a vertical-type probe. Each of the plurality of probes 5 is fixed to each of the plurality of probe lands on the surface 11 serving as the opposite side to the side of the supporting substrate 3 of the wiring layer 4. Therefore, in the case of the probe 5 a cantilever-type probe as an example, each of the plurality of probes 5 is supported in a cantilever girder form on the surface 11 serving as the opposite side to the side of the supporting substrate 3 of the wiring layer 4, so as to be respectively arranged at a predetermined position.

The probe 5 is arranged on the surface 11 serving as the opposite side to the side of the supporting substrate 3 of the wiring layer 4 so as to be connected to the wiring 2 via the probe land. As described above, the wiring 2 forms the wiring path of the probe card 1. Therefore, each of the plurality of probes 5 fixed to each of the probe lands of the wiring layer 4 is electrically connected to each of the plurality of connection terminals arranged on the connection terminal surface 9 of the supporting substrate 3.

The probe card 1 having the above-described structure is virtually divided into a plurality of heater regions arrayed in the vertical and horizontal directions in plan view, as described above.

FIG. 2 is a diagram schematically showing a structure of the probe card of the first embodiment of the present invention virtually divided into a plurality of heater regions.

FIG. 2 schematically shows a structure of the probe card 1 virtually divided into a plurality of heater regions according to the plurality of heater regions 10, by use of the supporting substrate 3 included in the probe card 1 of the first embodiment of the present invention. In FIG. 2, each of the heaters 6 in a meandering shape arranged in each of the plurality of heater regions 10 is schematically shown by a solid line.

In FIG. 2, each heater region 10 is a rectangular region surrounded by a broken line in plan view as in FIG. 1. As shown in FIG. 2 and FIG. 1 described above, the supporting substrate 3 of the probe card 1 is virtually divided into a plurality of heater regions according to the plurality of heater regions 10 regularly arrayed at equal intervals in the vertical and horizontal directions.

For example, as shown in FIG. 2, the plurality of heater regions 10 has substantially the same area and substantially the same rectangular shape. The supporting substrate 3 included in the probe card 1 is desirably divided virtually according to the plurality of heater regions 10 regularly arrayed in the vertical and horizontal directions without any gap (temperature difference gap) formed between heater regions. Therefore, the heater region 10 desirably has a rectangular shape.

In the case of the heater region 10 having a rectangular shape, one side thereof desirably has a length in the range of 10 mm to 40 mm. By setting a size of each heater region 10 in such a range, in the case of the supporting substrate 3 having, for example, a circular shape with a radius of approx. 30 cm, the supporting substrate 3 may be virtually divided into a plurality of heater regions according to the approx. 100 to 600 units of the heater regions 10.

Setting the size of the heater region 10 in the above-described range and providing a large number of the heater regions 10 may provide more uniform temperature distribution on the supporting substrate 3, as described below. From the viewpoint of providing further uniform temperature distribution on the supporting substrate 3 and also keeping the ease of manufacturing, the heater region desirably has in plan view a rectangular shape with one side thereof having a length in the range of 10 mm to 30 mm.

As shown in FIG. 2, the plurality of heater regions 10 may be arrayed such that a row of the heater regions 10 including the plurality of heater regions 10 arrayed in an X-axis direction is arrayed sequentially in a plurality of stages in a Y-axis direction. In such a case, as shown in FIG. 2, the supporting substrate 3 is virtually divided according to the plurality of heater regions 10 arrayed in such a manner that the row of the heater regions 10 including the plurality of heater regions 10 arrayed in the X-axis direction is arrayed sequentially in the plurality of stages in the Y-axis direction.

As described above, each heater region 10 has substantially the same rectangular shape in plan view. Therefore, on the supporting substrate 3, each of the plurality of heater regions 10 is arrayed regularly at equal intervals in the vertical and horizontal directions, and the supporting substrate 3 is virtually divided accordingly. That is, the supporting substrate 3 of the probe card 1 is virtually divided into a plurality of heater regions according to the plurality of heater regions 10 arrayed regularly at equal intervals in the vertical and horizontal directions in plan view.

In the probe card 1, as shown in FIG. 2, the rows of the heater regions 10 arrayed sequentially in the Y-axis direction may be arranged with arrangement pitches of the heater regions 10 matching with one another without any deviation between adjacent rows of the heater regions 10. In such a case, the plurality of heater regions 10 are arranged in a matrix form in the X-axis direction and the Y-axis direction on the supporting substrate 3, thus enabling the virtual division of the supporting substrate 3.

Here, the array structure of the plurality of heater regions 10 in the probe card 1 is not limited to the one illustrated in FIG. 2.

Figure 3:
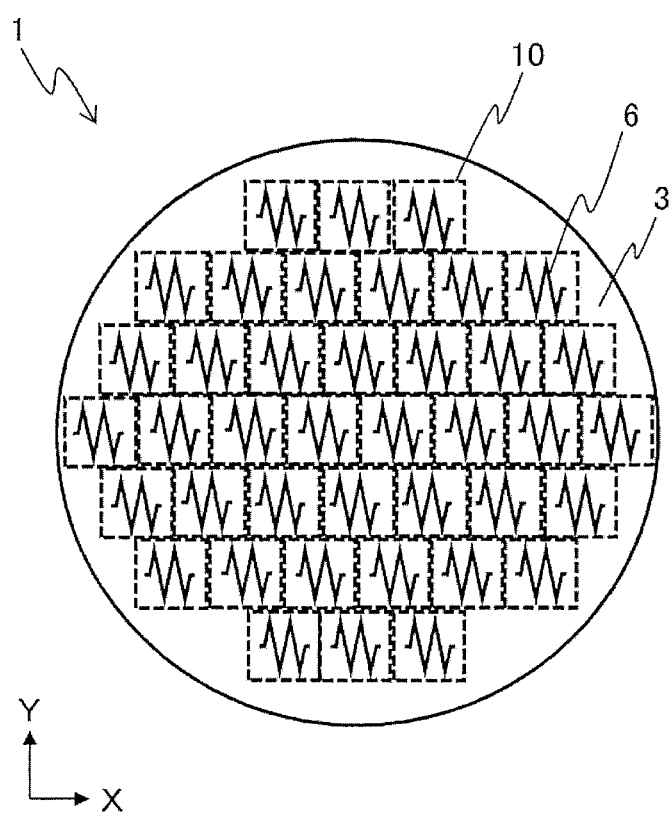
FIG. 3 is a diagram schematically showing another example of the structure of the probe card of the first embodiment of the present invention virtually divided into a plurality of heater regions.

FIG. 3 is a diagram schematically showing another example of the structure of the probe card of the first embodiment of the present invention virtually divided into a plurality of heater regions.

FIG. 3 schematically shows with a solid line the heater 6 in a meandering shape arranged in each of the plurality of heater regions 10.

As illustrated in FIG. 3, in the array structure of the plurality of heater regions 10, as for the rows of the heater regions 10 arrayed sequentially in the Y-axis direction, another structure is also available where arrangement pitches of the heater regions 10 are shifted by a half pitch between adjacent rows of the heater regions 10. The heater regions 10 individually having rectangular shapes in such an array structure of the heater regions 10 as shown in FIG. 3 may reduce remaining regions out of, for example, substantially circular supporting substrate 3, thus enabling the more efficient virtual division of the supporting substrate 3 into a plurality of heater regions.

As described above, the probe card 1 is configured including the plurality of heaters 6 arranged corresponding to each of the plurality of heater regions 10 of the supporting substrate 3.

Each of the plurality of heaters 6 is desirably embedded in the supporting substrate 3 corresponding to each of the plurality of heater regions 10. In such a case, as shown in FIG. 1, the parts serving as the connection terminals of the heater 6 are desirably arranged so as to be exposed from the connection terminal surface 9.

The number of the heaters 6 arranged in each heater region 10 is not limited to one as in the probe card 1 illustrated in FIG. 1. Two or more heaters 6 may be arranged in the heater region 10. In addition, the same number of heaters 6 may not be arranged in all of the plurality of heater regions 10. The numbers of heaters 6 to be arranged may be different among the heater regions 10. In the probe card 1, at least one of the plurality of heaters 6 is arranged in each of the heater regions 10.

In the probe card 1, the heater 6 may have a spiral shape or a meandering shape. That is, in the case of the heater 6 in a meandering shape extending in the X-axis direction between both terminals, the heater 6 may be formed in a zigzag pattern repeatedly bending while folding back in the ±Y-axis direction.

As shown in FIG. 1, the parts serving as the connection terminals of the both ends of the heater 6 are desirably arranged so as to be exposed from the connection terminal surface 9.

The heater 6 may be of a resistance heating element such as nickel-chromium alloy (nichrome wire), chromium-aluminum-iron alloy (kanthal wire), molybdenum (Mo), tantalum (Ta) or tungsten (W).

The heater 6 of such material may be made at the same time as the formation of the wiring path part by use of the same material as the wiring path part of the supporting substrate 3, that is, in the case where the supporting substrate 3 is made of ceramics, for example, by use of molybdenum, tungsten, or the like. In such a case, simultaneously forming the heater 6 in a spiral shape or the above-described meandering shape using the same material as the wiring path part enables the increase of the calorific value thereof compared to the wiring path part, whereby the heater 6 may be easily formed.

Further, as described above, the probe card 1 has the plurality of controllers 15 that individually control a calorific value of each of the plurality of heaters 6. Each of the plurality of controllers 15 controls a calorific value generated by one heater 6 so that the one heater 6 connected to the controller 15 heats to a target temperature one heater region 10 in which the one heater 6 is included.

Each of the plurality of controllers 15 includes a power source 16 and a control circuit 17. Each of the plurality of controllers 15 is configured so that the control circuit 17 is connected to one corresponding power source 16, and the power source 16 is connected to the terminals of the both ends of one corresponding heater 6. Therefore, the probe card 1 has the plurality of controllers 15, resulting in having the plurality of power sources 16 and the plurality of control circuits 17.

The plurality of control circuits 17 individually and independently control each of the plurality of power sources 16. That is, each of the plurality of control circuits 17 individually and independently controls one power source 16 connected thereto out of the plurality of power sources 16 so as to supply current to each of the heaters 6.

Each of the plurality of power sources 16 individually and independently supplies current to each of the plurality of heaters 6 for generation of heat by the heaters 6. That is, each of the plurality of power sources 16 individually and independently supplies current for generation of heat to one heater 6 connected thereto out of the plurality of heaters 6.

Therefore, the probe card 1 is configured so that each of the plurality of controllers 15 individually controls a calorific value generated by each of the plurality of heaters 6.

Then, the probe card 1 is capable of controlling each of the plurality of heaters 6 so as to bring a temperature of each heater region 10 to a desired temperature in the range of, for example, 80° C. to 150° C. As a result, the probe card 1 may have uniform temperature distribution at a desired temperature in the range of 80° C. to 150° C.

Further, as described above, the probe card 1 has the plurality of temperature sensors 7 arranged corresponding to each of the plurality of heater regions 10. Each of the plurality of temperature sensors 7 is connected to the control circuit 17 of the controller 15 arranged corresponding to the heater region 10 in which the temperature sensor 7 is arranged.

Each temperature sensor 7 is desirably arranged so as to be able to measure the temperature of the heater region 10 in which the temperature sensor 7 is arranged. For example, as shown in FIG. 1, each of the plurality of temperature sensors 7 is desirably embedded in the supporting substrate 3 corresponding to each of the plurality of heater regions 10. In such a case, as shown in FIG. 1, the parts serving as the connection terminals of the temperature sensor 7 are desirably arranged so as to be exposed from the connection terminal surface 9.

The temperature sensor 7 is a temperature detection device that detects a temperature of the heater region 10 in which the temperature sensor 7 is arranged, and the detection element thereof may be of, for example, a thermocouple, a thermistor, or the like.

In the probe card 1, the control circuit 17 is capable of, upon reception of output from the temperature sensor 7 connected thereto, measuring the temperature of the heater region 10 in which the temperature sensor 7 is arranged. For example, the control circuit 17 is capable of measuring the current value of the temperature sensor 7 as output from the temperature sensor 7 connected thereto, and thus capable of measuring, based on the measured current value, the temperature of the heater region 10 in which the temperature sensor 7 is arranged.

The number of the temperature sensors 7 arranged in each heater region 10 is not limited to one as in the probe card 1 illustrated in FIG. 1. Two or more temperature sensors 7 may be arranged in the heater region 10. In addition, the same number of temperature sensors 7 may not be arranged in all of the plurality of heater regions 10. The numbers of temperature sensors 7 to be arranged may be different among the plurality of heater regions 10. Therefore, in the probe card 1, at least one of the plurality of temperature sensors 7 is arranged in each of the plurality of heater regions 10.

In the probe card 1 having the above-described structure, the control circuits 17 of the plurality of controllers 15 arranged corresponding to each of the plurality of heater regions 10 individually and independently control the plurality of power sources 16 connected to the control circuits 17 based on a target temperature of the probe card 1. In such a case, one control circuit 17 of one controller arranged corresponding to one heater region 10 controls one power source 16 connected thereto based on a target temperature of the probe card 1.

The plurality of power sources 16 controlled by each of the plurality of control circuits 17 individually and independently supplies current to each of the plurality of heaters 6 connected thereto. In such a case, one power source 16 of one controller arranged corresponding to one heater region 10 supplies current to one heater 6 connected thereto.

The plurality of heaters 6 to which current is supplied generate heat individually and independently based on the amounts of current supplied from the power sources 16. As a result, the plurality of heaters 6 individually and independently heat each of the plurality of heater regions 10. In such a case, one heater 6 heats one heater region 10 in which the heater 6 is arranged.

As described above, each of the plurality of heater regions 10 of the probe card 1 is individually heated by the controller 15 and the heater 6 included therein so as to achieve a desired temperature, that is, a target temperature. As a result, in the probe card 1 virtually divided into a plurality of heater regions according to the plurality of heater regions 10, the entire thereof is heated based on the control in each of the plurality of heater regions 10.

Each of the control circuits 17 of the plurality of controllers 15 arranged in the plurality of heater regions 10 measures a temperature of each of the plurality of heater regions 10 based on output from the corresponding temperature sensor 7. In such a case, one control circuit 17 measures the temperature of one heater region 10 in which the control circuit 17 is arranged.

Then, each of the plurality of control circuits 17 repeats controlling of the power source 16 connected thereto and heating by the heater 6 connected to the power source 16 until the temperature of the heater region 10 measured by the corresponding temperature sensor 7 reaches a target temperature of the probe card 1 described above.

That is, the probe card 1 feedback-controls current supplied to each heater 6 by use of each controller 15 and each temperature sensor 7, so as to keep a temperature of each heater region 10 measured by each temperature sensor 7 at a constant value, that is, to keep a temperature constant at a target temperature.

The probe card 1 having the above-described structure is capable of individually performing heating by the heaters 6, temperature measurement by the temperature sensors 7, and controlling of temperature adjustment by the controllers 15 for each virtually-divided heater region 10, thereby enabling uniform temperature distribution under more precise control to a desired temperature than in prior art.

Embodiment 2

The probe card of the second embodiment of the present invention may be virtually divided into a plurality of heater regions as in the probe card of the first embodiment of the present invention described above, including a plurality of heaters arranged corresponding to each of the plurality of heater regions, so as to provide precise control of temperature distribution.

In the probe card of the second embodiment, a heat insulating member is arranged in the supporting substrate at a boundary part between heater regions. That is, in the probe card of the second embodiment, the supporting substrate is virtually divided by the heat insulating member corresponding to the plurality of heater regions.

Further, in the probe card of the second embodiment, a plurality of heaters are arranged corresponding to each of the plurality of heater regions, thereby providing more precise control of temperature distribution. Further, in the probe card, a plurality of temperature sensors may be arranged corresponding to each of the plurality of heater regions, thereby enabling further precise control of the temperature distribution.

The probe card of the second embodiment will be detailed below with reference to figures. However, except for arrangement of a heat insulating member, the probe card of the second embodiment has the components common to the probe card 1 of the first embodiment of the present invention described with reference to FIG. 1 and other figures. Therefore, the same reference numerals are given to the components common to the probe card 1 of the first embodiment of the present invention, and redundant description will be omitted.

Figure 4:
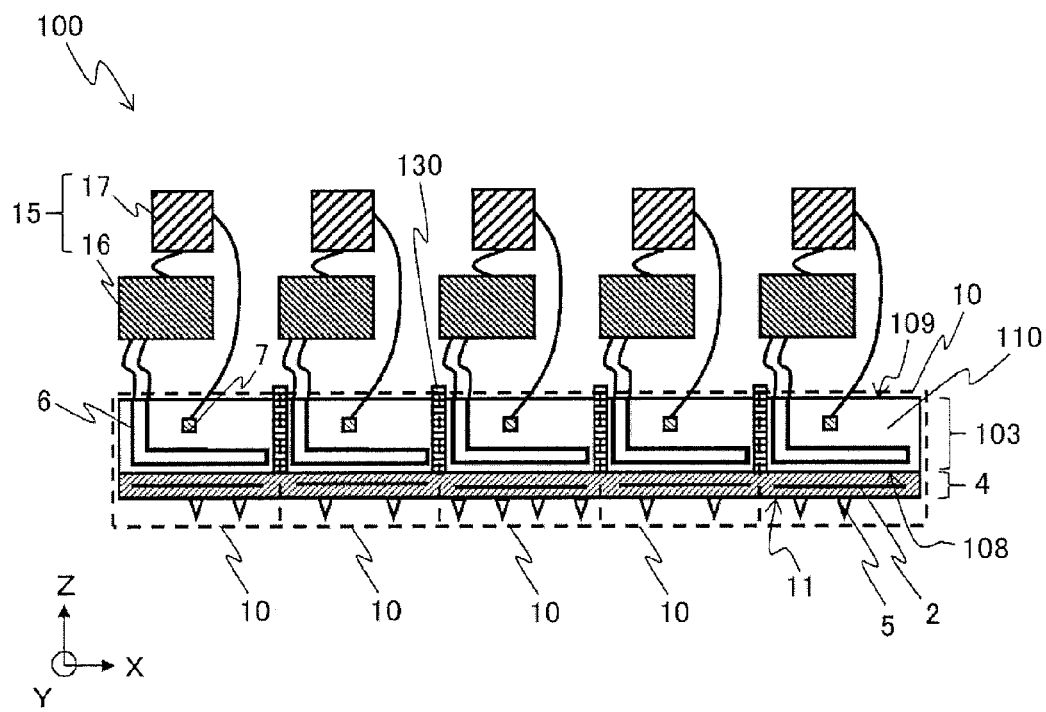
FIG. 4 is a cross-sectional view schematically showing a structure of a probe card of a second embodiment of the present invention.

FIG. 4 is a cross-sectional view schematically showing a structure of the probe card of the second embodiment of the present invention.

As shown in FIG. 4, the probe card 100 is configured including a supporting substrate 103, the wiring layer 4 arranged including the wiring 2 on a main surface 108 which is one surface of the supporting substrate 103, the probe 5 which is arranged on the surface 11 serving as the opposite side to the side of the supporting substrate 103 of the wiring layer 4 so as to be connected to the wiring 2, and the plurality of heaters 6.

The probe card 100 is virtually divided into a plurality of heater regions according to the plurality of heater regions 10 arrayed at equal intervals in the vertical and horizontal directions in plan view. In FIG. 4, each heater region 10 is shown as a region surrounded by a broken line.

In the probe card 100, the supporting substrate 103 is divided by a heat insulating member 130, corresponding to each of the plurality of heater regions 10. That is, the supporting substrate 103 has the heat insulating member 130 at a part corresponding to a boundary between adjacent heater regions 10.

Figure 5:
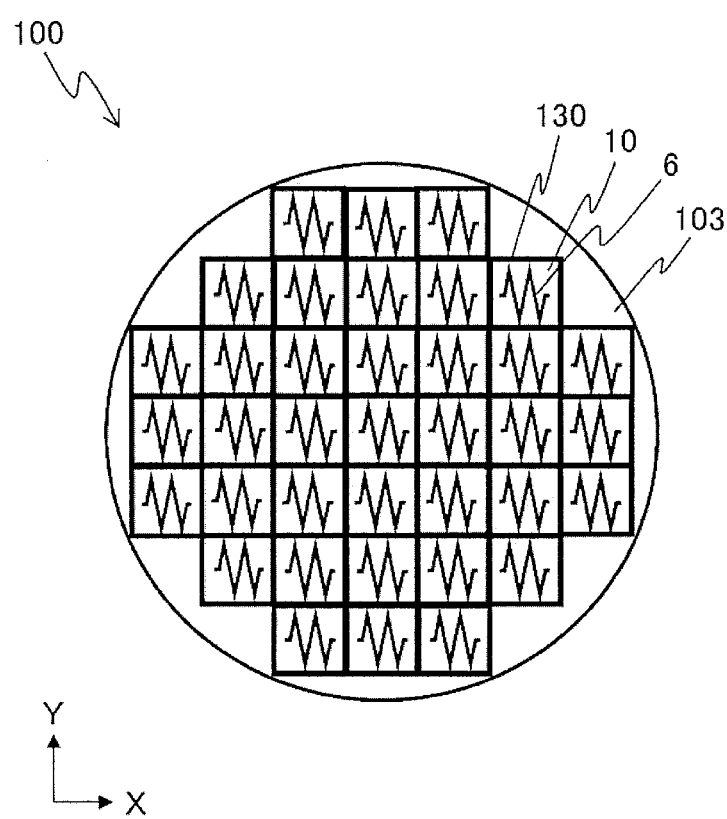
FIG. 5 is a plan view schematically showing a structure of a heat insulating member arranged in a supporting substrate.

FIG. 5 is a plan view schematically showing a structure of the heat insulating member arranged in the supporting substrate.

As shown in FIG. 4 and FIG. 5, the supporting substrate 103 has the heat insulating member 130 at a part corresponding to a boundary between adjacent heater regions 10. In this case, FIG. 5 schematically shows for convenience the heat insulating member 130 with a black solid line.

FIG. 5 schematically shows with a solid line the heater 6 in a meandering shape arranged in each of the plurality of heater regions 10.

In the supporting substrate 103, the heat insulating member 130 is desirably formed in a partition wall shape illustrated in FIG. 4 so as to partition the inside of the supporting substrate 103 corresponding to the plurality of heater regions 10. The heat insulating member 130 provides the effect of heat insulation between adjacent heater regions 10 which sandwich the heat insulating member 130.

The heat insulating member 130 is desirably configured in a partition wall shape, as illustrated in FIG. 4 and FIG. 5. That is, as shown in FIG. 4, the heat insulating member 130 has a partition wall shape extending in the thickness direction thereof from a connection terminal surface 109 of the supporting substrate 103 toward the main surface 108.

The end part of the heat insulating member 130 on the side of the connection terminal surface 109 of the supporting substrate 103 is formed so as to protrude from the connection terminal surface 109 as illustrated in FIG. 4. However, the protruding structure of the end part of the heat insulating member 130 as shown in FIG. 4 is not indispensable. The heat insulating member 130 may be in a shape where the end part thereof on the side of the connection terminal surface 109 and the connection terminal surface 109 form the same plane, that is, being in a so-called flush shape. The heat insulating member 130 may also be formed so that the end part thereof on the side of the connection terminal surface 109 thereof is embedded below the connection terminal surface 109.

As shown in FIG. 4, the end part of the heat insulating member 130 on the side of the main surface 108 of the supporting substrate 103 may be formed so as to be in contact with the wiring layer 4. However, the structure of the end part being in contact with the wiring layer 4 as illustrated in FIG. 4 is not indispensable. The end part on the side of the main surface 108 of the heat insulating member 130 may be formed inside the supporting substrate 103 at a position away from the wiring layer 4. In such a case, the heat insulating member 130 is desirably formed so that the effect of heat insulation between heater regions 10 by the heat insulating member 130 is not reduced.

In addition, the cross-sectional shape of the heat insulating member 130 in a partition wall shape may be of an oblong shape as illustrated in FIG. 4. However, an oblong shape is not indispensable as the cross-sectional shape of the heat insulating member 130. The cross-sectional shape of the heat insulating member 130 may have various shapes such as an inverted triangular shape and a trapezoidal shape, in addition to the oblong shape as illustrated in FIG. 4.

Figure 6:
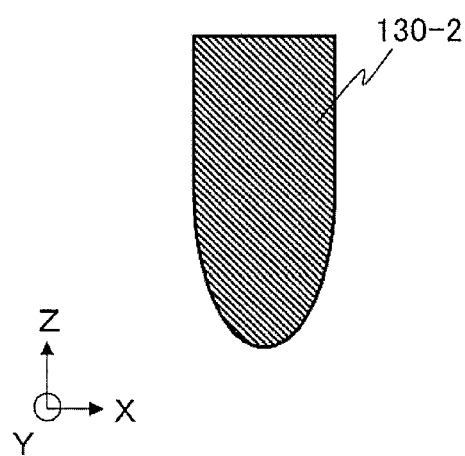
FIG. 6 is a diagram schematically showing a cross-sectional shape of another example of the heat insulating member.

FIG. 6 is a diagram schematically showing a cross-sectional shape of another example of the heat insulating member.

As shown in FIG. 6, a heat insulating member 130-2 which is another example of the heat insulating member 130 may have a cross-sectionally rounded shape at the end part of the lower side of the figure, that is, at the end part of the side facing the wiring layer 4 in FIG. 4.

In the formation of the heat insulating member 130, a groove is provided at a part corresponding to a boundary between heater regions 10 of the supporting substrate 103 and then the groove is filled with the heat insulating member 130. More specifically, a groove is formed through engraving of the supporting substrate 103 from the side of the connection terminal surface 109, and then the groove is filled with a material serving as a precursor of the heat insulating member 130.

The heat insulating member 130 may be of silicone rubber, silicone sponge, glass wool or the like. Air may also be available as the heat insulating member 130.

In the probe card 100, at least one of the above-described plurality of heaters 6 is arranged in each of the plurality of heater regions 10. For example, in the probe card 100, as shown in FIG. 4, one of the plurality of heaters 6 is embedded in the supporting substrate 103 corresponding to each of the plurality of heater regions 10. In such a case, each of the plurality of heaters 6 is embedded in the supporting substrate 103 inside a space 110 partitioned by the heat insulating member 130 inside the supporting substrate 103.

Therefore, the probe card 100 has the plurality of heaters 6 arranged respectively corresponding to each of the plurality of heater regions 10. Then, for example, the effect by the heat insulating member 130 formed in a partition wall shape may suppress heat generation by each of the plurality of heaters 6 from affecting temperatures of other heater regions 10 than the heater region 10 including the heater 6.

That is, in the probe card 100, one heater 6 is embedded in the supporting substrate 103 so as to be arranged inside one heater region 10, for example, inside one space 110 partitioned by the heat insulating member 130 inside the supporting substrate 103. Then, in the probe card 100, the one heater 6 heats an inside of one space 110 partitioned by the heat insulating member 130 inside the supporting substrate 103, resulting in providing efficient heating of the heater region 10 including the one heater 6. The probe card 100 is configured so that heating of the heater region 10 including the one heater 6 does not affect temperatures of other heater regions 10, for example, another heater region 10 adjacent to the heater region 10.

Further, the probe card 100 has the plurality of controllers 15 each of which controls a calorific value of each of the plurality of heaters 6. Each of the controllers 15 includes the power source 16 and the control circuit 17. Each of the controllers 15 is configured so that the control circuit 17 is connected to one corresponding power source 16, and the power source 16 is connected to the terminals of the both ends of one corresponding heater 6. Therefore, the probe card 100 has the plurality of controllers 15, resulting in having the plurality of power sources 16 and the plurality of control circuits 17.

The probe card 100 is capable of controlling each of the plurality of heaters 6 by use of the plurality of controllers 15 so as to bring a temperature of each heater region 10 to a desired temperature in the range of, for example, 80° C. to 150° C. As a result, the probe card 100 may have uniform temperature distribution at a desired temperature in the range of 80° C. to 150° C.

Further, the probe card 100 may have the plurality of temperature sensors 7. For example, in the probe card 100, as shown in FIG. 4, one of the plurality of temperature sensors 7 is embedded in the supporting substrate 103 corresponding to each of the plurality of heater regions 10. Each of the plurality of temperature sensors 7 is embedded in the supporting substrate 103, for example, inside the space 110 partitioned by the heat insulating member 130 inside the supporting substrate 103.

Therefore, in the probe card 100, at least one of the plurality of temperature sensors 7 is arranged in each of the plurality of heater regions 10. That is, the probe card 100 has the plurality of temperature sensors 7 arranged individually corresponding to each of the plurality of heater regions 10. Each of the plurality of temperature sensors 7 is connected to the control circuit 17 of the controller 15 arranged corresponding to the heater region 10 in which the temperature sensor 7 is arranged.

In the probe card 100, the control circuit 17 is capable of, upon reception of output from the temperature sensor 7 connected thereto, measuring the temperature of the heater region 10 in which the temperature sensor 7 is arranged. For example, the control circuit 17 is capable of measuring the current value of the temperature sensor 7 as output from the temperature sensor 7 connected thereto, and thus capable of measuring, based on the measured current value, the temperature of the heater region 10 in which the temperature sensor 7 is arranged.

In the probe card 100 of the present embodiment having the above-described structure, each of the plurality of heater regions 10 is individually heated by the controller 15 and the heater 6 so as to achieve a desired temperature, that is, a target temperature. As a result, in the probe card 100 virtually divided into a plurality of heater regions according to the plurality of heater regions 10, the entire thereof is heated based on the control in each of the plurality of heater regions 10.

The supporting substrate 103 has, as described above, the heat insulating member 130 at a part corresponding to a boundary of the plurality of heater regions 10 there between. The inside of the supporting substrate 103 is partitioned and divided corresponding to each of the plurality of heater regions 10 by the heat insulating member 130. Therefore, the probe card 100 is capable of suppressing the influence of heating individually performed in each of the plurality of heater regions 10 from affecting other adjacent heater regions 10.

Each of the plurality of control circuits 17 repeats controlling of the power source 16 connected thereto and heating by the heater 6 connected to the power source 16 until the temperature of the heater region 10 measured by the corresponding temperature sensor 7 reaches a target temperature of the probe card 100 described above.

That is, the probe card 100 uses each controller 15 and each temperature sensor 7, so as to keep a temperature of each heater region 10 measured by each temperature sensor 7 at a constant value, that is, to keep a temperature constant at a target temperature. Then, the probe card 100 performs feedback-control of current supplied to each heater 6 by use of each controller 15 and each temperature sensor 7.

In the probe card 100, the feedback-control described above is performed for each heater region 10. In such a case, the effect by the heat insulating member 130 arranged in the supporting substrate 103 may suppress the influence of heating individually performed in each of the plurality of virtually-divided heater regions 10 from affecting other adjacent heater regions 10.

As a result, the probe card 100 is capable of providing uniform temperature distribution at a higher level under more precise control to a desired temperature than in prior art.

Embodiment 3

The third embodiment of the present invention relates to an inspection apparatus having a probe card. In an inspection apparatus, a probe card is used as an inspection tool for electrical connection between an object to be inspected and an electrical circuit of a test wiring substrate or the like. Then, the inspection apparatus of the third embodiment inspects an object to be inspected by conducting an electrical test on the object to be inspected by use of the probe card of the present invention.

For example, as the probe card, the above-described probe card of the first embodiment of the present invention is available. Therefore, in the inspection apparatus of the third embodiment, the probe card may be virtually divided into a plurality of heater regions, and a plurality of heaters are arranged corresponding to each of the plurality of heater regions, thereby enabling more precise control of temperature distribution.

In the inspection apparatus of the third embodiment of the present invention, the probe card may include a plurality of temperature sensors arranged corresponding to each of the plurality of heater regions. Therefore, the probe card is capable of performing feedback-control for each heater region in the plurality of heater regions, thus enabling further precise control of temperature distribution.

As described above, the inspection apparatus of the third embodiment of the present invention is capable of inspecting an object to be inspected by conducting an electrical test on the object to be inspected by use of the probe card which is capable of precisely controlling temperature distribution, and which has uniform temperature distribution under control to a desired temperature.

Herein below, the inspection apparatus of the third embodiment of the present invention will be detailed with reference to figures. As described above, a probe card may be of the probe card 1 of the first embodiment of the present invention shown in FIG. 1 and other figures. In such a case, the inspection apparatus is configured including the components common to the probe card 1 described with reference to FIG. 1 and other figures. Therefore, in the description of the inspection apparatus, the same reference numerals are given to the components common to the probe card 1 of the first embodiment of the present invention, and redundant description will be omitted.

Figure 7:
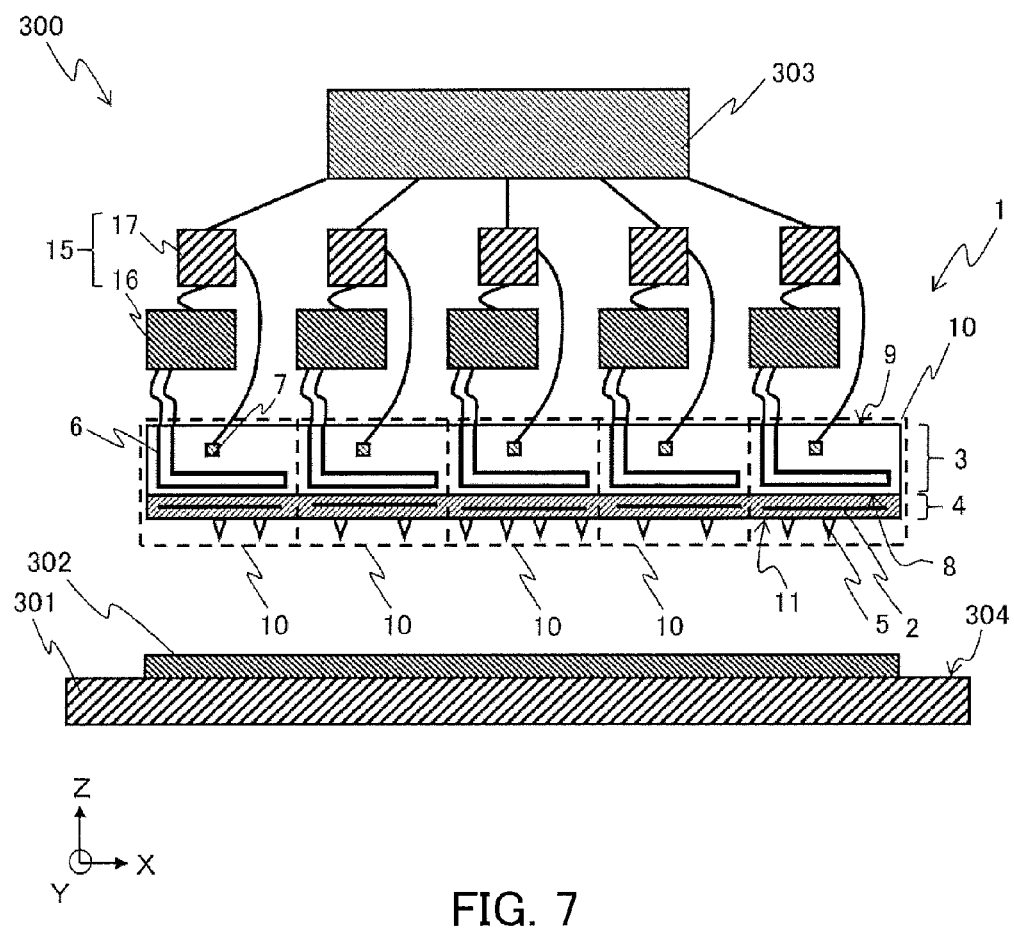
FIG. 7 is a cross-sectional view schematically showing a main part structure of an inspection apparatus of a third embodiment of the present invention.

FIG. 7 is a cross-sectional view schematically showing a main part structure of the inspection apparatus of the third embodiment of the present invention.

As shown in FIG. 7, the inspection apparatus 300 is configured including an XYZ stage 301, the probe card 1, and a temperature controller 303 to which a target temperature of the probe card 1 is input.

In the inspection apparatus 300, an object to be inspected may be, for example, a semiconductor chip (not shown in the figure) formed on a semiconductor wafer 302. The semiconductor wafer 302 on which a semiconductor chip as an object to be inspected is formed is placed on the XYZ stage 301.

The XYZ stage 301 is capable of sucking and fixing an object to be inspected by use of negative pressure and stably holding the object, on a main surface 304 serving as a surface for placement of the object to be inspected. Therefore, the XYZ stage 301 receives on the main surface 304 the semiconductor wafer 302 on which a semiconductor chip as an object to be inspected is formed, and stably holds the semiconductor wafer 302 by sucking and fixing the semiconductor wafer 302. The XYZ stage 301 that holds an object to be inspected by sucking and fixing as above is also called a suction table or the like.

The XYZ stage 301 is rotatable around the Z axis serving as a vertical axis, and is also movable along the X axis and the Y axis on the XY plane perpendicular to the Z axis. Therefore, the semiconductor wafer 302 placed on the main surface 304 of the XYZ stage 301 may be rotated around the Z axis as the XYZ stage 301 moves, and may be moved respectively along the X axis and the Y axis on the XY plane perpendicular to the Z axis.

Further, the XYZ stage 301 has a heater (not shown in the figure) for heating the semiconductor wafer 302 placed on the main surface 304. In an example, the heater is incorporated in the XYZ stage 301. That is, the XYZ stage 301 has the heater and receives in a heatable state the semiconductor wafer 302 on which a semiconductor chip as an object to be inspected is formed.

Therefore, in the electrical test in which the semiconductor wafer 302 is heated, the heater of the XYZ stage 301 of the inspection apparatus 300 is capable of heating the semiconductor wafer 302 placed on the XYZ stage 301 to a predetermined temperature.

The temperature controller 303 is a temperature controlling apparatus to which a target temperature of the probe card 1 is input. The temperature controller 303 includes a plurality of connection channels (not shown in the figure), and each of the plurality of connection channels is connected to each of the plurality of controllers 15 arranged so as to individually control a calorific value of each of the plurality of heaters 6 of the probe card 1. The temperature controller 303 is used to bring a temperature of each of the plurality of heater regions 10 of the probe card 1 to a desired target temperature.

As described above, the probe card 1 is the probe card 1 of the first embodiment of the present invention shown in FIG. 1 and other figures. As shown in FIG. 7, the probe 5 is arranged so as to face the semiconductor wafer 302 placed on the XYZ stage 301.

The probe card 1 is configured including the supporting substrate 3, the wiring layer 4 arranged including the wiring 2 on the main surface 8 serving as one surface of the supporting substrate 3, the probe 5 which is arranged on the surface 11 serving as the opposite side to the side of the supporting substrate 3 of the wiring layer 4 so as to be connected to the wiring 2, and the plurality of heaters 6.

The probe card 1 is virtually divided into the plurality of heater regions 10 arrayed in the vertical and horizontal directions in plan view. In FIG. 7, each heater region 10 is shown as a region surrounded by a broken line.

In the probe card 1, at least one of the above-described plurality of heaters 6 is arranged in each of the plurality of heater regions 10. In the probe card 1, as shown in FIG. 1, one of the plurality of heaters 6 is embedded in the supporting substrate 3 corresponding to each of the plurality of heater regions 10. Therefore, the probe card 1 has the plurality of heaters 6 arranged corresponding to each of the plurality of heater regions 10.

Further, the probe card 1 has the plurality of controllers 15 that individually control a calorific value of each of the plurality of heaters 6. Each of the plurality of controllers 15 includes the power source 16 and the control circuit 17. Each of the plurality of controllers 15 is configured so that the control circuit 17 is connected to one corresponding power source 16, and the power source 16 is connected to the terminals of the both ends of one corresponding heater 6. Therefore, the probe card 1 has the plurality of controllers 15, resulting in having the plurality of power sources 16 and the plurality of control circuits 17.

The probe card 1 is capable of controlling each of the plurality of heaters 6 by use of the plurality of controllers 15 so as to bring a temperature of each heater region 10 to a desired temperature in the range of, for example, 80° C. to 150° C. As a result, the probe card 1 may have uniform temperature distribution at a desired temperature in the range of 80° C. to 150° C.

Further, the probe card 1 has the plurality of temperature sensors 7. In the probe card 1, as shown in FIG. 7, one of the plurality of temperature sensors 7 is embedded in the supporting substrate 3 corresponding to each of the plurality of heater regions 10. Therefore, in the probe card 1, at least one of the plurality of temperature sensors 7 is arranged in each of the plurality of heater regions 10. That is, the probe card 1 has the plurality of temperature sensors 7 arranged corresponding to each of the plurality of heater regions 10. Then, each of the plurality of temperature sensors 7 is connected to the control circuit 17 of the controller 15 arranged corresponding to the heater region 10 in which the temperature sensor 7 is arranged.

In the probe card 1, the control circuit 17 is capable of, upon reception of output from the temperature sensor 7 connected thereto, measuring a temperature of the heater region 10 in which the temperature sensor 7 is arranged. In an example, the control circuit 17 is capable of measuring the current value of the temperature sensor 7 as output from the temperature sensor 7 connected thereto, and thus capable of measuring, based on the measured current value, the temperature of the heater region 10 in which the temperature sensor 7 is arranged.

In the probe card 1 of the present embodiment having the above-described structure, the control circuits 17 of the plurality of controllers 15 arranged corresponding to each of the plurality of heater regions 10 individually and independently control the plurality of power sources 16 connected to the control circuits 17, based on a target temperature of the probe card 1 input in the temperature controller 303. In such a case, one control circuit 17 of one controller 15 arranged corresponding to one heater region 10 controls one power source 16 connected thereto based on a target temperature of the probe card 1.

Then, the plurality of power sources 16 controlled by each of the plurality of control circuits 17 individually and independently supplies current to each of the plurality of heaters 6 connected thereto. In such a case, one power source 16 of one controller 15 arranged corresponding to one heater region 10 supplies current to one heater 6 connected thereto.

The plurality of heaters 6 to which current is supplied generate heat individually and independently based on the amounts of current supplied from the power sources 16. As a result, the plurality of heaters 6 individually and independently heats each of the plurality of heater regions 10. In such a case, one heater 6 heats one heater region 10 in which the heater 6 is arranged.

As described above, the probe card 1 is heated individually in each of the plurality of heater regions 10 so as to achieve a desired temperature by the controllers 15 and the heaters 6 included in the probe card 1. As a result, the probe card 1 virtually divided into a plurality of heater regions according to the plurality of heater regions 10 is heated.

Each of the control circuits 17 of the plurality of controllers 15 arranged in the plurality of heater regions 10 measures a temperature of each of the plurality of heater regions 10 based on the output from the corresponding temperature sensor 7. In such a case, one control circuit 17 measures a temperature of one heater region 10 in which the one control circuit 17 is arranged.

Then, each of the plurality of control circuits 17 repeats controlling of the power source 16 connected thereto and heating by the heater 6 connected to the power source 16 until the temperature of the heater region 10 measured by the corresponding temperature sensor 7 reaches a target temperature of the probe card 1 described above.

That is, the probe card 1 performs feedback-control of current supplied to each heater 6 by use of each controller 15 and each temperature sensor 7, so as to keep a temperature of each heater region 10 measured by each temperature sensor 7 at a constant value, that is, to keep a temperature constant at a target temperature.

As a result, the probe card 1 is capable of, for each virtually-divided heater region 10, individually performing heating by the heater 6, temperature measurement by the temperature sensor 7, and controlling of temperature adjustment by the controller 15, thereby enabling to provide uniform temperature distribution under more precise control to a desired temperature than in prior art.

As described above, the inspection apparatus 300 including the XYZ stage 301, the probe card 1 and the temperature controller 303 heats the semiconductor wafer 302 placed on the XYZ stage 301 to a predetermined temperature by use of the heater incorporated in the XYZ stage 301, in the electrical test in which the semiconductor wafer 302 is heated.

On the other hand, in the inspection apparatus 300, as described above, the probe card 1 has uniform temperature distribution under more precise control to a target temperature in which temperature control for each virtually-divided heater region 10 is performed.

Therefore, in the inspection apparatus 300, the semiconductor wafer 302 may be set to a predetermined temperature, and at the same time, the probe card 1 may be brought to a desired target temperature.

The temperature of the semiconductor wafer 302 and a target temperature of the probe card 1 may be set to the same temperature. Further, the inspection apparatus 300 is capable of setting a target temperature of the probe card 1 so that the target temperature of the probe card 1 differs from the temperature of the semiconductor wafer 302, in consideration of the difference between the coefficient of thermal expansion of the material of the semiconductor wafer 302 and the coefficient of thermal expansion of the material of the supporting substrate 3 and/or the wiring layer 4 of the probe card 1. Then, the inspection apparatus 300 is set so that no deviation occurs between the spacing between the probes 5 on the probe card 1 and the spacing between the electrodes of the semiconductor chip heated to a predetermined temperature.

As a result, the inspection apparatus 300 is capable of bringing each of the large number of probes 5 of the probe card 1 from above into contact with each of minute electrodes (not shown in the figure) for inspection of the semiconductor chip. Then, the inspection apparatus 300 is capable of providing electrical connection between the electrodes of the semiconductor chip and a device (not shown in the figure) such as a tester of a prober, by use of the probe card 1.

Embodiment 4

The fourth embodiment of the present invention relates to an inspection apparatus having a probe card. In an inspection apparatus, a probe card is used as an inspection tool for electrical connection between an object to be inspected and an electrical circuit of a test wiring substrate or the like. Then, the inspection apparatus of the fourth embodiment inspects an object to be inspected by conducting an electrical test on the object to be inspected by use of the probe card of the present invention.

For example, as the probe card, the above-described probe card of the second embodiment of the present invention is available. Therefore, in the inspection apparatus of the fourth embodiment of the present invention, the probe card may be virtually divided into a plurality of heater regions, and a plurality of heaters are arranged corresponding to each of the plurality of heater regions, thereby enabling precise control of temperature distribution. Further, in the probe card, a heat insulating member may be arranged in a supporting substrate at a boundary part between heater regions.

Furthermore, the probe card may include a plurality of temperature sensors arranged corresponding to each of the plurality of heater regions. Therefore, the probe card is capable of performing feedback-control for each heater region in a plurality of heater regions, thus enabling further precise control of temperature distribution.

As described above, the inspection apparatus of the fourth embodiment of the present invention is capable of inspecting an object to be inspected by conducting an electrical test on the object to be inspected by use of the probe card having uniform temperature distribution under control to a desired temperature.

Here, the inspection apparatus of the fourth embodiment of the present invention will be detailed with reference to figures. As described above, the probe card may be of the probe card 100 of the second embodiment of the present invention shown in FIG. 4 and other figures. In such a case, the inspection apparatus is configured including the components common to the probe card 100 described with reference to FIG. 4 and other figures. The inspection apparatus has the same structure as the inspection apparatus 300 of the third embodiment of the present invention, except for including the probe card 100 in place of the probe card 1. Therefore, in the description of the inspection apparatus, the same reference numerals are given to the components common to the probe card 100 of the second embodiment of the present invention and the inspection apparatus 300 of the third embodiment of the present invention, and redundant description will be omitted.

Figure 8:
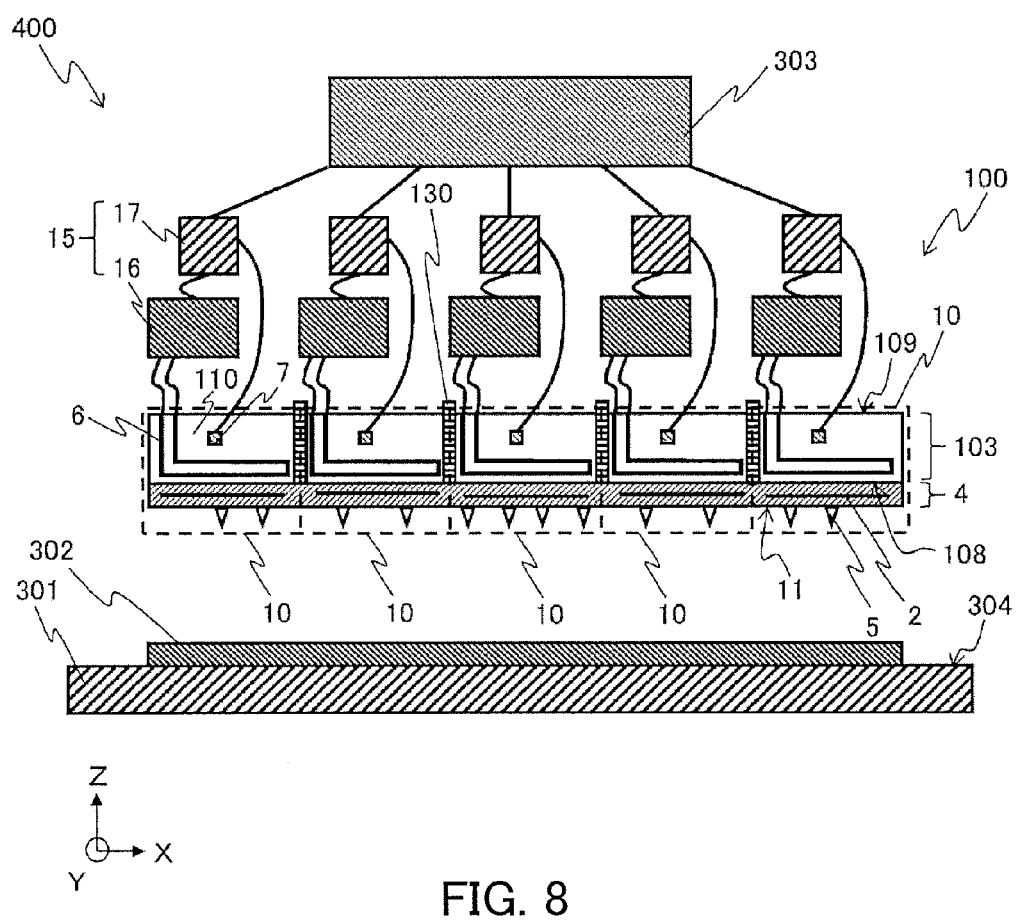
FIG. 8 is a cross-sectional view schematically showing a main part structure of an inspection apparatus of a fourth embodiment of the present invention.

FIG. 8 is a cross-sectional view schematically showing a main part structure of the inspection apparatus of the fourth embodiment of the present invention.

As shown in FIG. 8, an inspection apparatus 400 is configured including the XYZ stage 301, the probe card 100, and the temperature controller 303 to which a target temperature of the probe card 100 is input.

In the inspection apparatus 400, as in the inspection apparatus 300 of the third embodiment of the present invention, an object to be inspected may be, for example, a semiconductor chip (not shown in the figure) formed on the semiconductor wafer 302. The semiconductor wafer 302 on which a semiconductor chip as an object to be inspected is formed is placed on the XYZ stage 301.

The XYZ stage 301 has a heater (not shown in the figure) for heating an object to be inspected placed on the main surface 304. The XYZ stage 301 has the heater and receives in a heatable state the semiconductor wafer 302 on which a semiconductor chip as an object to be inspected is formed.

Therefore, in the electrical test in which the semiconductor wafer 302 is heated, the inspection apparatus 400 is capable of heating the semiconductor wafer 302 placed on the XYZ stage 301 to a predetermined temperature.

As described above, the probe card 100 is the probe card 100 of the second embodiment of the present invention shown in FIG. 4 and other figures.

Therefore, the probe card 100 is configured including the supporting substrate 103, the wiring layer 4 arranged including the wiring 2 on the main surface 108 serving as one surface of the supporting substrate 103, the probe 5 which is arranged on the surface 11 serving as the opposite side to the side of the supporting substrate 103 of the wiring layer 4 so as to be connected to the wiring 2, and the plurality of heaters 6.

The probe card 100 is virtually divided into a plurality of heater regions according to the plurality of heater regions 10 arrayed at equal intervals in the vertical and horizontal directions in plan view. In FIG. 8, each heater region 10 is shown as a region surrounded by a broken line.

In the probe card 100, the supporting substrate 103 is divided by the heat insulating member 130 corresponding to each of the plurality of heater regions 10. That is, in the supporting substrate 103, the heat insulating member 130 is arranged at a part corresponding to a boundary between adjacent heater regions 10.

In the probe card 100, at least one of the above-described plurality of heaters 6 is arranged in each of the plurality of heater regions 10. In the probe card 100, in an example, as shown in FIG. 8, one of the plurality of heaters 6 is embedded in the supporting substrate 103 corresponding to each of the plurality of heater regions 10. In such a case, each of the plurality of heaters 6 is embedded in the supporting substrate 103 inside the space 110 partitioned by the heat insulating member 130 inside the supporting substrate 103.

Therefore, the probe card 100 has the plurality of heaters 6 arranged corresponding to each of the plurality of heater regions 10. Then, in an example, the effect by the heat insulating member 130 formed in a partition wall shape may suppress heat generation by each of the plurality of heaters 6 from affecting temperatures of other heater regions 10 than the heater region 10 including the heater 6.

That is, in the probe card 100, one heater 6 is embedded in the supporting substrate 103 so as to be arranged inside one heater region 10, for example, inside one space 110 partitioned by the heat insulating member 130 inside the supporting substrate 103. Then, in the probe card 100, the one heater 6 heats an inside of one space 110 partitioned by the heat insulating member 130 inside the supporting substrate 103, resulting in providing efficient heating only of the heater region 10 including the one heater 6. The probe card 100 is configured so that heating of the heater region 10 including the one heater 6 does not affect temperatures of other heater regions 10, for example, another heater region 10 adjacent to the heater region 10.

Further, the probe card 100 has the plurality of controllers 15 that individually control a calorific value of each of the plurality of heaters 6. Each of the plurality of controllers 15 includes the power source 16 and the control circuit 17. Each of the controllers 15 is configured so that the control circuit 17 is connected to one corresponding power source 16, and the power source 16 is connected to the terminals of the both ends of one corresponding heater 6.

The probe card 100 is capable of controlling each of the plurality of heaters 6 by use of the plurality of controllers 15 so as to bring a temperature of each heater region 10 to a desired temperature in the range of, for example, 80° C. to 150° C. As a result, the probe card 100 may have uniform temperature distribution at a desired temperature in the range of 80° C. to 150° C.

Further, the probe card 100 has the plurality of temperature sensors 7. In the probe card 100, as shown in FIG. 7, one of the plurality of temperature sensors 7 is embedded in the supporting substrate 103 corresponding to each of the plurality of heater regions 10. Therefore, in the probe card 100, at least one of the plurality of temperature sensors 7 is arranged in each of the plurality of heater regions 10. Then, each of the plurality of temperature sensors 7 is connected to the control circuit 17 of the controller 15 arranged corresponding to the heater region 10 in which the temperature sensor 7 is arranged.

In the probe card 100, the control circuit 17 is capable of, upon reception of output from the temperature sensor 7 connected thereto, measuring a temperature of the heater region 10 in which the temperature sensor 7 is arranged. For example, the control circuit 17 is capable of measuring the current value of the temperature sensor 7 as output from the temperature sensor 7 connected thereto, and thus capable of measuring, based on the measured current value, the temperature of the heater region 10 in which the temperature sensor 7 is arranged.

In the probe card 100 of the present embodiment having the above-described structure, each of the plurality of heater regions 10 is individually heated by the controller 15 and the heater 6 so as to achieve a desired temperature. As a result, the probe card 100 virtually divided into a plurality of heater regions according to the plurality of heater regions 10 is entirely heated according to the control in each of the plurality of heater regions 10.

The supporting substrate 103 has, as described above, the heat insulating member 130 at a part corresponding to a boundary between adjacent heater regions 10. The inside of the supporting substrate 103 is partitioned and divided corresponding to each of the plurality of heater regions 10 by the heat insulating member 130. Therefore, the probe card 100 is capable of suppressing the influence of heating individually performed in each of the plurality of heater regions 10 from affecting other adjacent heater regions 10.

Then, the probe card 100 uses each controller 15 and each temperature sensor 7 so as to keep a temperature of each heater region 10 measured by each temperature sensor 7 at a constant value, that is, to keep a temperature constant at a target temperature. Then the probe card 100 performs feedback-control of current supplied to each heater 6 by use of each controller 15 and each temperature sensor 7.

As a result, the probe card 100 is capable of, for each virtually-divided heater region 10, individually performing heating by the heater 6, temperature measurement by the temperature sensor 7, and controlling of temperature adjustment by the controller 15. Then, the effect by the heat insulating member 130 arranged in the supporting substrate 103 may suppress the influence of heating individually performed in the plurality of virtually-divided heater regions 10 from affecting other adjacent heater regions 10.

As a result, the probe card 100 is capable of providing uniform temperature distribution at a higher level under more precise control to a desired temperature than in prior art.

As described above, the inspection apparatus 400 including the XYZ stage 301, the probe card 100 and the temperature controller 303 heats the semiconductor wafer 302 placed on the XYZ stage 301 to a predetermined temperature by use of the heater incorporated in the XYZ stage 301, in an electrical test in which the semiconductor wafer 302 is heated.

On the other hand in the inspection apparatus 400, as described above, the probe card 100 has uniform temperature distribution under more precise control to a target temperature in which temperature control is performed for each virtually-divided heater region 10.

Therefore, in the inspection apparatus 400, the semiconductor wafer 302 may be set to a predetermined temperature, and at the same time, the probe card 100 may be brought to a desired target temperature.

The temperature of the semiconductor wafer 302 and a target temperature of the probe card 100 may be set to the same temperature. Further, a target temperature of the probe card 100 may be set so that the target temperature of the probe card 100 differs from the temperature of the semiconductor wafer 302, in consideration of the difference between the coefficient of thermal expansion of the material of the semiconductor wafer 302 and the coefficient of thermal expansion of the material of the supporting substrate 103 and/or the wiring layer 4 of the probe card 100. Then, the inspection apparatus 400 is set so that no deviation occurs between the spacing between the probes 5 on the probe card 100 and the spacing between the electrodes of the semiconductor chip heated to a predetermined temperature.

As a result, the inspection apparatus 400 is capable of bringing each of the large number of probes 5 of the probe card 100 from above into contact with each of minute electrodes (not shown in the figure) for inspection of the semiconductor chip. Then, the inspection apparatus 400 is capable of providing electrical connection between the electrodes of the semiconductor chip and a device (not shown in the figure) such as a tester of a prober, by use of the probe card 100.

Embodiment 5

The fifth embodiment of the present invention relates to an inspection method for inspecting an object to be inspected by use of a probe card. A probe card of an inspection apparatus is used as an inspection tool for electrical connection between an object to be inspected and an electrical circuit of a test wiring substrate or the like. That is, by use of an inspection apparatus having the probe card of the present invention, an object to be inspected is inspected through conduction of an electrical test on the object to be inspected.

The inspection method of the fifth embodiment is desirably carried out by use of the inspection apparatus 300 of the third embodiment of the present invention described above in FIG. 7. As described above, the inspection apparatus 300 of the third embodiment of the present invention is configured including the XYZ stage 301 on which the semiconductor wafer 302 where a semiconductor chip as an object to be inspected is formed is placed, the probe card 1 placed so that the probes 5 thereof face the semiconductor wafer 302, and the temperature controller 303 to which a target temperature of the probe card 1 is input.

Therefore, the inspection method of the present invention is desirably carried out, for example, through heating of an object to be inspected to a desired temperature, and by use of the probe card 1 of the first embodiment of the present invention, at the same time heating of the probe card 1 to a target temperature.

The probe card 1 to be used in the inspection method of the present embodiment includes the supporting substrate 3, the wiring layer 4 arranged including the wiring 2 on the main surface 8 of the supporting substrate 3, the probe 5 which is arranged on the surface 11 serving as the opposite side to the side of the supporting substrate 3 of the wiring layer 4 so as to be connected to the wiring 2, the plurality of heaters 6, the plurality of controller 15 which individually control a calorific value of each of the plurality of heaters 6, and the plurality of temperature sensors 7. The probe card 1 is configured including at least one of the plurality of heaters 6 and at least one of the plurality of temperature sensors 7 in each of the heater regions 10, so as to be virtually divided into a plurality of heater regions according to the plurality of heater regions 10 arrayed at equal intervals in the vertical and horizontal directions in plan view.

In the inspection method of the present embodiment, a temperature of each of the plurality of heater regions 10 is desirably individually controlled through individually controlling of the calorific value by each of the plurality of heaters 6 by use of the above-described probe card 1. In the inspection method of the present embodiment, an object to be inspected is desirably inspected after the temperature of the probe card 1 is brought to the target temperature.

Herein blow, the inspection method of the fifth embodiment of the present invention will be detailed. Particularly, a method for controlling a temperature of each of the plurality of heater regions included in a main part of the method will be detailed by use of FIG. 9 below and also with reference to FIG. 1, and FIG. 7 and other figures.

Figure 9:
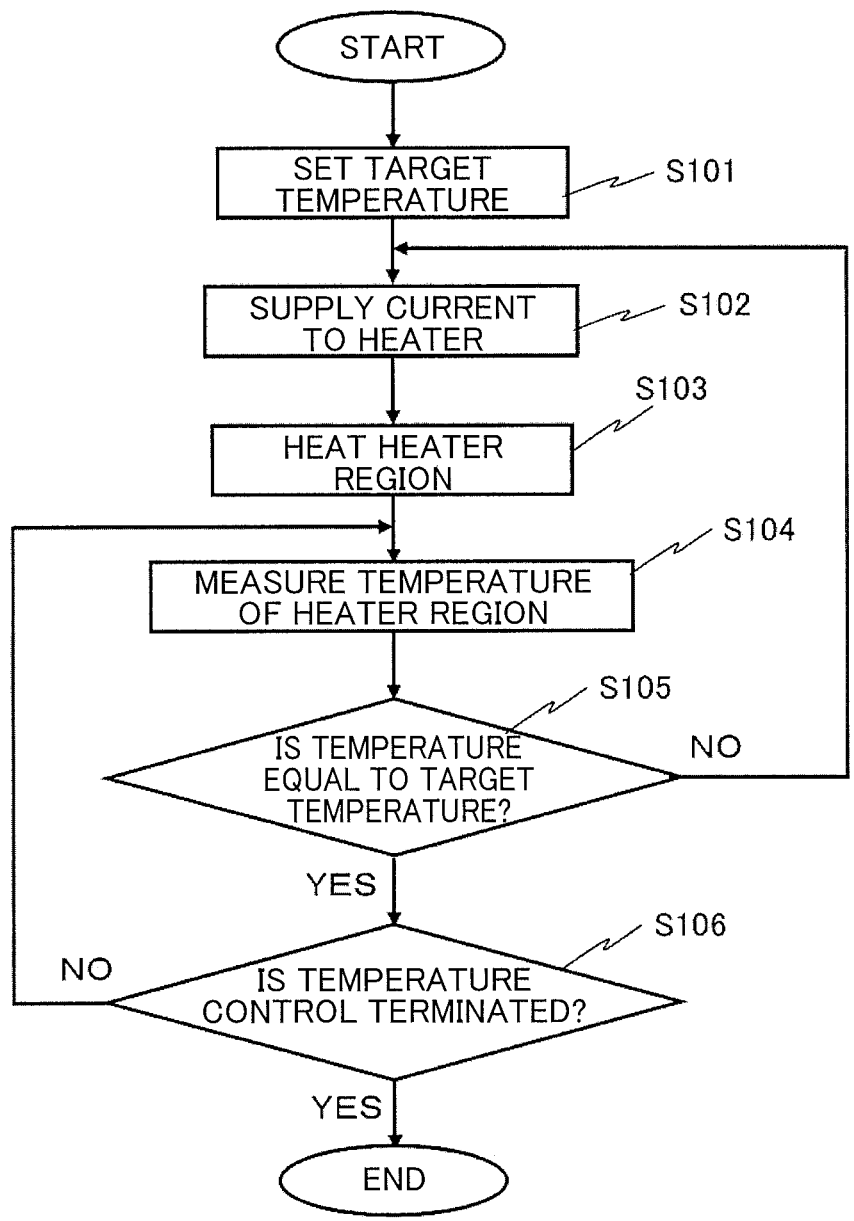
FIG. 9 is an example of a flowchart describing a method for controlling a temperature of each of a plurality of heater regions in an inspection method of a fifth embodiment of the present invention.

FIG. 9 is one example of a flowchart for describing a method for controlling a temperature of each of a plurality of heater regions in an inspection method of the fifth embodiment of the present invention.

In the inspection method of the present embodiment, for start of the method for controlling a temperature of each of the plurality of heater regions 10 (hereinafter simply referred to as "temperature control method"), a target temperature of a probe card is set first (S101: temperature setting step).

Specifically, in order to heat the probe card 1 for use, a target temperature as a target for heating the probe card 1 is determined, and the target temperature data is input to the temperature controller 303 of the inspection apparatus 300. That is, the target temperature of the probe card 1 is set in a manner that the target temperature data is input to the temperature controller 303. At this time, in the inspection apparatus 300, the temperature controller 303 is connected to each of the plurality of controllers 15 of the probe card 1 so that the target temperature data input to the temperature controller 303 is readable by each of the plurality of controllers 15. The above-described target temperature may be a desired temperature, for example, in the range of 80° C. to 150° C.

Then, current is supplied to the heater 6 of the probe card 1 of the inspection apparatus 300 based on the above-described target temperature (S102: current supplying step).

As described above, the probe card 1 has the plurality of controllers 15 for individually controlling a calorific value of each of the plurality of heaters 6, and each of the plurality of controllers 15 includes the power source 16 and the control circuit 17. Each of the plurality of controllers 15 is configured so that one control circuit 17 is connected to one corresponding power source 16, and the one power source 16 is connected to the terminals of the both ends of one corresponding heater 6.

Therefore, in the probe card 1, each of the plurality of control circuits 17 of the controller 15 reads out the data of the target temperature input to the temperature controller 303, and individually and independently controls one power source 16 connected thereto based on the read-out target temperature data. That is, one control circuit 17 reads out the target temperature data input to the temperature controller 303, and controls one power source 16 connected thereto based on the read-out target temperature data. Then, in the probe card 1, the plurality of heaters 6 individually controlled by each of the plurality of controllers 15 are individually and independently supplied with current.

Therefore, in the temperature control method in each of the plurality of heater regions 10, one heater 6 is supplied with current under the control of one controller 15 of the probe card 1.

Then, by use of the heater 6 to which current is supplied, the heater region 10 in which the heater 6 is arranged is heated (S103: heating step).

As described above, each of the plurality of heaters 6 of the probe card 1 is embedded in the supporting substrate 3 corresponding to each of the plurality of heater regions 10. Therefore, in each of the plurality of heater regions 10, at least one of the plurality of heaters 6 is arranged.

Therefore, in the temperature control method, the heater 6 supplied with current in the current supplying step (S102) individually heats the heater region 10 in which the heater 6 is arranged, based on the amount of supplied current. As a result, the probe card 1 is heated in a manner that, in the probe card 1, each of the plurality of heaters 6 is individually controlled to individually heat each of the plurality of heater regions 10.

Then, by use of the temperature sensor 7 arranged in the heater region 10, a temperature of the heater region 10 is measured based on the output of the temperature sensor 7 (S104: temperature measuring step).

As described above, the probe card 1 has the plurality of temperature sensors 7 arranged corresponding to each of the plurality of heater regions 10. Each of the plurality of temperature sensors 7 is connected to the control circuit 17 of the controller 15 arranged corresponding to the heater region 10 in which the temperature sensor 7 is arranged.

Therefore, each of the plurality of control circuits 17 of the probe card 1 is capable of, upon reception of output from one temperature sensor 7 connected thereto, measuring a temperature of one heater region 10 in which the temperature sensor 7 is arranged.

Therefore, in the temperature control method, a temperature of one heater region 10 is measured by use of one temperature sensor 7 arranged in the one heater region 10.

Then, in the temperature control method, in the case where a temperature of the heater region 10 is equal to the above-described target temperature after measurement of the temperature of the heater region 10 in the above-described temperature measuring step (S104), the temperature measuring step (S104) is determined to be repeated (S105: determining step) until the end of the temperature control.

More specifically, in the case where the temperature of the heater region 10 is equal to the target temperature in the determining step (S105), the process proceeds to a termination determining step (S106) in which whether to terminate the temperature control is determined. Then, in the case where in the termination determining step (S106) the temperature control is determined to be continued, the process returns to the temperature measuring step (S104) to repeat the temperature measuring step (S104).

In the case where the temperature control is determined to be terminated in the termination determining step (S106), the temperature control ends.

On the other hand, in the case where in the determining step (S105) it is determined that the temperature of the heater region 10 differs from the target temperature, the determination results in the process returning to the current supplying step (S102), and the steps of the current supplying step (S102), the heater heating step (S103) and the temperature measuring step (S104) being repeated in this order (S105: determining step).

As described above, in the inspection method of the present embodiment, the temperature control method includes the temperature setting step (S101), the current supplying step (S102), the heating step (S103), the temperature measuring step (S104), the determining step (S105) and the termination determining step (S106). According to the temperature control method, a calorific value by each of the plurality of heaters 6 of the probe card 1 may be controlled individually.

In the above-described temperature control method by use of the probe card 1, current for supplying to each heater 6 is feedback-controlled by use of each controller 15 and each temperature sensor 7, so as to keep a temperature of each heater region 10 measured by each temperature sensor 7 at a constant value, that is, to keep a temperature constant at a target temperature.

The inspection method of the present embodiment is capable of providing control so as to bring the temperature of the probe card 1 to a target temperature, by performing a heating control by the above-described temperature control method resulting in performing a temperature control, individually and independently to the plurality of heater regions 10 of the probe card 1.

As a result, in the inspection method of the present embodiment, the probe card 1 is capable of providing more uniform temperature distribution under more precise control to a desired temperature than in prior art.

Then, according to the inspection method of the present embodiment, in the probe card 1, occurrence of a deviation may be prevented between the spacing between the probes 5 and the spacing between the electrodes of the semiconductor chip. Further, according to the inspection method of the present embodiment, a crack of the supporting substrate 3 and/or breakage of the probe card 1 occurring at the time of inspection may be reduced.

In the inspection method of the present embodiment, while the above-described temperature control method is performed, each of the large number of probes 5 in the probe card 1 may be brought from above into contact with, for example, each of minute electrodes (not shown in the figure) for inspection of the semiconductor chip. Then the inspection method of the present embodiment may provide electrical connection between the electrodes of the semiconductor chip and a device (not shown in the figure) such as a tester of a prober by use of the probe card 1.

As a result, in the inspection method of the present embodiment, in order to provide electrical connection between an object to be inspected and an electrical circuit of a test wiring substrate or the like, a probe card having uniform temperature distribution under control at a desired temperature may be used, thus enabling to conduct an electrical test on the object to be inspected.

In the inspection method of the fifth embodiment of the present invention, as an example, the inspection apparatus 300 of the third embodiment of the present invention described above in FIG. 7 is used. Thus, the probe card 1 of the first embodiment of the present invention shown in FIG. 1 is used and heated to a target temperature.

However, as another example of the inspection method of the fifth embodiment of the present invention, the inspection apparatus 400 of the fourth embodiment of the present invention described above in FIG. 8 may be used. Thus, in another example of the inspection method of the fifth embodiment of the present invention, the probe card 100 of the second embodiment of the present invention shown in FIG. 4 may be used and heated to the target temperature thereof for inspection on an object to be inspected.

That is, in another example of the inspection method of the fifth embodiment of the present invention, the probe card 100 shown in FIG. 4 is desirably used. The probe card 100 shown in FIG. 4 includes the supporting substrate 103, the wiring layer 4 arranged including the wiring 2 on the main surface 108 of the supporting substrate 103, the probe 5 which is arranged on the surface 11 serving as the opposite side to the side of the supporting substrate 103 of the wiring layer 4 so as to be connected to the wiring 2, the plurality of heaters 6, the plurality of controllers 15 which individually control a calorific value by each of the plurality of heaters 6, and the plurality of temperature sensors 7.

Then, the probe card 100 is configured with at least one of the plurality of heaters 6 and at least one of the plurality of temperature sensors 7 arranged in each of the heater regions 10, so as to be virtually divided into a plurality of heater regions according to the plurality of heater regions 10 arrayed at equal intervals in the vertical and horizontal directions in plan view. In addition, in the probe card 100, the supporting substrate 103 includes the heat insulating member 130 at a part corresponding to a boundary between adjacent heater regions 10.

In another example of the inspection method of the fifth embodiment of the present invention, a temperature of each of the plurality of heater regions 10 partitioned and divided by the heat insulating member 130 may be individually controlled by use of the above-described probe card 100 to individually control a calorific value of each of the plurality of heaters 6.

Then, in another example of the inspection method of the fifth embodiment of the present invention, the method of individually controlling a temperature of each of the plurality of heater regions 10 is the same as the above-described temperature control method according to the flowchart illustrated in FIG. 9, except for using the inspection apparatus 400 instead of the inspection apparatus 300.

As a result, another example of the inspection method of the fifth embodiment of the present invention may provide uniform temperature distribution at a higher level under more precise temperature control in each heater region 10 by use of the inspection apparatus 400 so as to bring the temperature of the probe card 100 to a target temperature. Another example of the inspection method of the fifth embodiment of the present invention may, while individually controlling a temperature of each of the plurality of heater regions 10 by use of the probe card 100, provide electrical connection between an object to be inspected, for example, an electrode of a semiconductor chip and a device such as a tester of a prober.

As a result, in another example of the inspection method of the fifth embodiment of the present invention, for the purpose of electrical connection between an object to be inspected and an electrical circuit of a test wiring substrate or the like, the probe card 100 having uniform temperature distribution under control to a desired temperature may be used, and thus an electrical test on the object to be inspected may be conducted.

It should be noted that the present invention is not limited to the above-described embodiments, and various modifications may be made in a range without departing from the spirit of the present invention.

In an example, the probe card 1 of the first embodiment of the present invention is, as shown in FIG. 1 and other figures, virtually divided into a plurality of heater regions according to the plurality of heater regions 10 arrayed in the vertical and horizontal directions in plan view, and the heater 6 is arranged in each of the heater regions 10. In such a case, the plurality of heaters 6 is individually embedded in the supporting substrate 3 corresponding to each of the plurality of heater regions 10.

However, in the present invention, the parts in which the plurality of heaters 6 is arranged are not necessarily limited in the supporting substrate 3.

In an example, in the present invention, as in the heater regions 10 shown in FIG. 1 and other figures, a probe card is virtually divided into a plurality of heater regions, and each of a plurality of heaters may be embedded in a wiring layer corresponding to each of the plurality of heater regions. In an example, in the probe card 1 shown in FIG. 1 and other figures, each of the plurality of heaters 6 may be embedded in the wiring layer 4.

In such a structure, each of a plurality of temperature sensors is also desirably embedded in the wiring layer corresponding to each of the plurality of heater regions. In an example, in the probe card 1 shown in FIG. 1 and other figures, each of the plurality of temperature sensors 7 may be embedded in the wiring layer 4.

In the probe card, the arrangement of heaters and temperature sensors in the wiring layer may provide more uniform temperature distribution under more precise control to a target temperature, in the wiring layer in which a probe is arranged.

As a result, the deviation occurring between the spacing between probes on the probe card and the spacing between electrodes of an object to be inspected which is heated to a predetermined temperature, for example, a semiconductor chip, may be more suppressed effectively.

While preferred embodiments of the present invention have been described and illustrated above, it is to be understood that they are exemplary of the invention and are not to be considered to be limiting. Additions, omissions, substitutions, and other modifications can be made thereto without departing from the spirit or scope of the present invention. Accordingly, the invention is not to be considered to be limited by the foregoing description and is only limited by the scope of the appended claims.

What is claimed is:

1. A probe card comprising:
   a supporting substrate;
   a wiring layer arranged including a wiring on one surface of the supporting substrate;
   a probe arranged on a surface serving as an opposite side to a side of the supporting substrate of the wiring layer so as to be connected to the wiring;
   a plurality of heater regions divided virtually in plan view and arrayed in vertical and horizontal directions; and
   a plurality of first heaters, at least one of the plurality of first heaters being arranged in each of the heater regions.

2. The probe card according to claim 1, further comprising a plurality of controllers for individually controlling a calorific value of each of the plurality of first heaters.

3. The probe card according to claim 1, wherein each of the plurality of first heaters is embedded in the supporting substrate corresponding to each of the plurality of heater regions.

4. The probe card according to claim 1, further comprising a plurality of temperature sensors arranged corresponding to each of the plurality of heater regions.

5. The probe card according to claim 1, wherein the heater regions has a rectangular shape in plan view, and one side of the rectangular shape is in a range of 10 mm to 40 mm.

6. The probe card according to claim 1, further comprising a heat insulating member arranged at a part corresponding to a boundary between the heater regions in the supporting substrate.

7. The probe card according to claim 1, further comprising a heat insulating member arranged at a part corresponding to a boundary between the heater regions in the supporting substrate,
   wherein the heat insulating member is formed in a partition wall shape for partitioning an inside of the supporting substrate corresponding to the plurality of heater regions.

8. An inspection apparatus for inspecting an object to be inspected by use of a probe card, the inspection apparatus comprising:
   an XYZ stage on which the object to be inspected being placed;
   the probe card according to claim 1, further comprising a plurality of controllers for individually controlling a calorific value of each of the plurality of first heaters; and
   a temperature controller to which a target temperature of the probe card being input.

9. The inspection apparatus according to claim 8, wherein the XYZ stage includes a second heater for receiving the object to be inspected in a heatable state.

10. The inspection apparatus according to claim 8, wherein the probe card has a plurality of temperature sensors arranged corresponding to each of the plurality of heater regions of the supporting substrate, and
    each of the plurality of controllers individually controls a calorific value of each of the plurality of first heaters based on the target temperature and an output by each of the plurality of temperature sensors.

11. The inspection apparatus according to claim 8, wherein the supporting substrate of the probe card further comprises a heat insulating member arranged at a part corresponding to a boundary between the heater regions.

12. An inspection method for inspecting an object to be inspected by use of a probe card, the inspection method comprising the step of:
    by use of the probe card according to claim 1, the probe card further comprising a plurality of controllers for individually controlling a calorific value of each of the plurality of first heaters and a plurality of temperature sensors,
    inspecting the object to be inspected by individually controlling a temperature of each of the plurality of heater regions so as to bring the probe card to a target temperature,
    wherein a temperature control for individually controlling the temperature of each of the plurality of heater regions includes:
      a temperature setting step of setting the target temperature;
      a current supplying step of supplying current to the first heaters based on the target temperature;
      a heater heating step of heating each of the heater regions including each of the first heaters by use of each of the first heaters supplied with the current; and
      a temperature measuring step of, by use of each of the temperature sensors arranged in each of the heater regions, measuring the temperature of each of the heater regions based on an output by each of the temperature sensors,
    and further includes, after the temperature measuring step, a determining step of determining repetition of the temperature measuring step, upon the temperature of each of the heater regions being equal to the target temperature, and of determining repetition in an order of the current supplying step, the heater heating step and the temperature measuring step, upon the temperature of each of the heater regions being different from the target temperature.

* * * * *